(12) United States Patent
Ishida et al.

(10) Patent No.: US 9,417,128 B2
(45) Date of Patent: Aug. 16, 2016

(54) EMISSION SIGNAL VISUALIZATION DEVICE

(71) Applicant: NOISE LABORATORY CO., LTD., Sagamihara, Kanagawa (JP)

(72) Inventors: Takeshi Ishida, Sagamihara (JP); Masahiko Ide, Sagamihara (JP); Kenji Kondo, Sagamihara (JP); Kenji Fujii, Sagamihara (JP)

(73) Assignee: NOISE LABORATORY CO., LTD., Sagamihara (JP)

( * ) Notice: Subject to any disclaimer, the term of this patent is extended or adjusted under 35 U.S.C. 154(b) by 171 days.

(21) Appl. No.: 14/513,310

(22) Filed: Oct. 14, 2014

(65) Prior Publication Data

US 2015/0029190 A1    Jan. 29, 2015

Related U.S. Application Data

(63) Continuation of application No. PCT/JP2013/055175, filed on Feb. 27, 2013.

(30) Foreign Application Priority Data

Apr. 20, 2012 (JP) ................... 2012-097176
Nov. 28, 2012 (JP) ................... 2012-259631

(51) Int. Cl.
| | |
|---|---|
| *G06T 17/00* | (2006.01) |
| *G01J 3/443* | (2006.01) |
| *G01K 3/14* | (2006.01) |
| *G01R 29/08* | (2006.01) |
| *G01B 11/22* | (2006.01) |
| *G01K 11/12* | (2006.01) |

(Continued)

(52) U.S. Cl.
CPC .............. *G01J 3/443* (2013.01); *G01B 11/22* (2013.01); *G01K 3/14* (2013.01); *G01K 11/12* (2013.01); *G01R 29/0871* (2013.01); *G01R 29/0892* (2013.01); *G06T 17/20* (2013.01); *G01J 3/2803* (2013.01); *G01J 2003/283* (2013.01); *G01K 2213/00* (2013.01); *G06T 2219/012* (2013.01); *G06T 2219/2012* (2013.01)

(58) Field of Classification Search
None
See application file for complete search history.

(56) References Cited

U.S. PATENT DOCUMENTS

| | | |
|---|---|---|
| 2003/0137511 A1 | 7/2003 | Aruga et al. |
| 2011/0273559 A1 | 11/2011 | Yagitani |

FOREIGN PATENT DOCUMENTS

| | | |
|---|---|---|
| CN | 1461459 A | 12/2003 |
| CN | 101013202 A | 8/2007 |

(Continued)

OTHER PUBLICATIONS

Office Action mailed Jan. 30, 2015 of corresponding Chinese Patent Application No. 201310064113.3.

(Continued)

*Primary Examiner* — Kee M Tung
*Assistant Examiner* — Frank Chen
(74) *Attorney, Agent, or Firm* — DC Patent Lawyers, PLLC

(57) ABSTRACT

An emission signal visualization device includes a front video camera for photographing a measured object from the front, a signal detecting sensor for detecting an emission signal generated from the measured object, a lateral video camera for photographing the signal detecting sensor from a lateral, a spectrum analyzer, and an analyzing body unit, and records and analyzes the state of the spatial distribution of signals detected by the signal detecting sensor.

8 Claims, 22 Drawing Sheets

(51) Int. Cl.
  *G06T 17/20*   (2006.01)
  *G01J 3/28*   (2006.01)

(56) References Cited

FOREIGN PATENT DOCUMENTS

| CN | 102141587 A | 8/2011 |
| JP | H04-205570 A | 7/1992 |
| JP | H06-058970 A | 3/1994 |
| JP | 2769472 B2 | 6/1998 |
| JP | 2003-066079 A | 3/2003 |
| JP | 2003-329716 A | 11/2003 |
| WO | 2009/028186 A1 | 3/2009 |

OTHER PUBLICATIONS

International Search Report of PCT/JP2013/055175 mailed Apr. 2, 2013.

EMISSION SIGNAL VISUALIZATION DEVICE

CROSS REFERENCE TO RELATED APPLICATIONS

This application is a Continuation of PCT Application No. PCT/JP2013/055175, filed on Feb. 27, 2013, and claims the priority of Japanese Patent Application No. 2012-097176 filed on Apr. 20, 2012 and the priority right based on Japanese Patent Application No. 2012-259631 filed on Nov. 28, 2012, the entire contents of the above three applications are incorporated herein by reference.

TECHNICAL FIELD

The present invention relates to an emission signal visualization device capable of giving in detail information on signals occurring around a measured object.

BACKGROUND ART

It has been known that unnecessary electromagnetic field noises (hereinafter, simply referred to as noises) generated from electronic, information, communication, and industrial devices influence adversely, such as malfunction, on other electronic devices.

Further, it has been concerned that noises give some influences to a human body, and the influences given by noises have been studied.

In order to specify such invisible noise generation source, it is effective to visualize noises. Hitherto, devices to visualize noises have been proposed (refer to Patent Literatures 1 to 3).

For example, a device disclosed in Patent Literature 1 creates a diagram in which the respective electromagnetic field intensities (signal levels) of noises are displayed in a color on a two-dimensional surface. A device disclosed in Patent Literature 3 performs frequency analysis of noises on the surface of a measured object, and creates a contour map of noises of a specific frequency.

A device disclosed in Patent Literature 2 determines the position of a sensor in a three-dimensional space around a measured object by parallax, and displays the respective electromagnetic field intensities (signal levels) of noises at the position in a color. Accordingly, a measurer can acquire information on the noises at the position of the sensor.

CITATION LIST

Patent Literature

Patent Literature 1: Japanese Patent No. 2769472
Patent Literature 2: International Patent Laid-Open Publication No. 2009/028186
Patent Literature 3: Japanese Patent Laid-Open Publication No. 2003-66079

SUMMARY OF INVENTION

Technical Problem

The device of each of Patent Literatures 1 and 3 holds only the information on noises in a two-dimensional surface, and the device of Patent Literature 2 holds only the information on noises at the position of a sensor. Accordingly, each of the devices has a problem that it is impossible to know in detail the distribution and intensity of noises in a three-dimensional space.

The present invention has been achieved in order to solve the above problem, and an object of the present invention is to obtain an emission signal visualization device capable of knowing in detail distribution, intensity, etc. of noises in a three-dimensional space around a measured object.

Solution to Problem

The present invention is an emission signal visualization device which acquires a signal generated from a measured object as a detection signal while moving a sensor in a rectangular parallelepiped measurement space with one surface stationarily facing a measured object and displays a signal level of the detection signal in a color on a display device, the emission signal visualization device including: a photographed image storage unit configured to store a photographed image acquired by photographing the measurement space for every given time; a three-dimensional memory that stores, in an analytical three-dimensional space model defined as a lattice-shaped mesh in which the measurement space is divided into a depth direction, a lateral width direction, and a height direction at respective given intervals, each section of the analytical three-dimensional space model in association with section management information including a three-dimensional coordinate of each section in the analytical three-dimensional space model, the detection signal, and a color value of a maximum signal level in the detection signal; a unit configured to display the photographed image stored in the photographed image storage unit on the display device; a unit configured to overlap and display a screen mesh frame constituted by screen sections associated with the section as a mesh frame for displaying an analytical result and the photographed image; a unit configured to sequentially specify the sections having a depth coordinate corresponding to a specified distance from the measured object; a unit configured to read, for each specified section, a two-dimensional coordinate constituting the three-dimensional coordinate assigned to the section and the color value assigned to the section; and a unit configured to display the screen section corresponding to the two-dimensional coordinate with a color of the read color value.

It is preferable that a largest signal level in the detection signal acquired for the every given time is further assigned together with the color value to the section of the analytical three-dimensional space model in the three-dimensional memory, and the emission signal visualization device further includes: a unit configured to sequentially specify the sections having a depth coordinate corresponding to a specified distance range from the measured object; a unit configured to classify the specified sections for each section group of sections having the same two-dimensional coordinate: a unit configured to read each the largest signal level assigned to each section belonging to the section group for each the section group and to determine the largest value among the largest signal levels as a largest intensity signal level; and a unit configured to display the screen section corresponding to the two-dimensional coordinate with a color of a color value corresponding to the largest intensity signal level.

It is preferable that the section management information includes a signal acquisition number to identify the detection signal, and the emission signal visualization device further includes: a signal storage unit configured to store the detection signal acquired for the every given time in association with the signal acquisition number; and a unit configured to display the detection signal identified by the signal acquisition number together with a mesh frame for displaying the analytical result on the display device.

It is preferable that the emission signal visualization device further includes: a first video camera that photographs the measurement space from a front direction; a second video camera that photographs the measurement space from a lateral direction; a color value table that shows a correspondence relation between the signal level and the color value; an image input unit configured to acquire the photographed image from the first video camera and the photographed image from the second video camera for every given time and to store these images in association with each other in the photographed image storage unit; a unit configured to generate a first photographed image from the first video camera or a second photographed image from the second video camera on the display device; a unit configured to create the analytical three-dimensional space model defined as a lattice-shaped mesh in which the measurement space is divided into a depth direction, a lateral width direction, and a height direction at respective given intervals; a unit configured to detect a cluster of neighboring pixels having color information of the sensor from the first photographed image and to set the cluster to be a shape image of the sensor from the front direction; a unit configured to detect a cluster of neighboring pixels having color information of the sensor from the second photographed images and to set the cluster to be a shape image of the sensor from the lateral direction; a unit configured to determine a sensor position from a center position of the shape image of the sensor from the front direction and a center position of the shape image of the sensor from the lateral direction, and to define a section including the sensor position in the analytical three-dimensional space model as a section corresponding to the sensor position; and a unit configured to determine, each time a section corresponding to the sensor position is defined in the analytical three-dimensional space model, a color value corresponding to the largest signal level in the detection signal in the section from the color value table, and to assign the color value to the defined section.

In the case where the sensor is a frequency information detecting sensor to detect signals containing frequency information, it is preferable that the emission signal visualization device further includes a frequency analyzer configured to calculate spectrum data of a detection signal detected by the frequency information detecting sensor as the detection signal.

The above-mentioned frequency information detecting sensor may be an electromagnetic field detecting sensor or a sound detecting sensor which detects a signal containing frequency information.

The sensor may be a radiation detecting sensor that detects radiation, digitizes this detection signal, and outputs the digitized detection signal as the detection signal.

The sensor may be a temperature detection sensor that detects a temperature, digitizes this detection signal, and outputs the digitized detection signal as the detection signal.

DESCRIPTION OF EMBODIMENTS

In this embodiment, a measured object is an IC substrate, a television set, etc., and an emission signal visualization device is configured to display in a color a distribution of electromagnetic field noises (also called simply noises) contained in a signal from such a measured object, and to visualize the noises.

Figure 3:
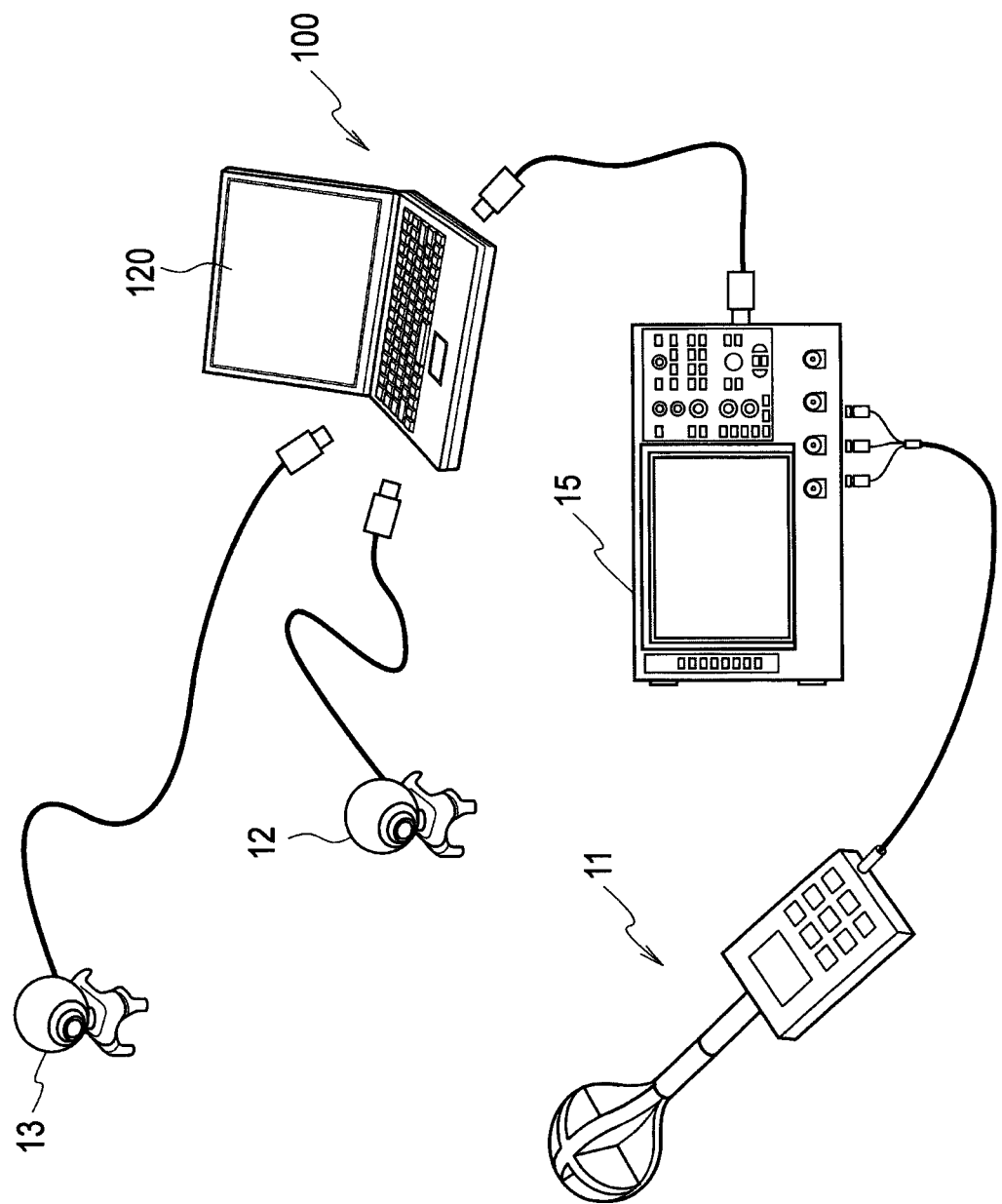
FIG. 3 is a connection configuration diagram of an emission signal visualization device.
Figure 5:
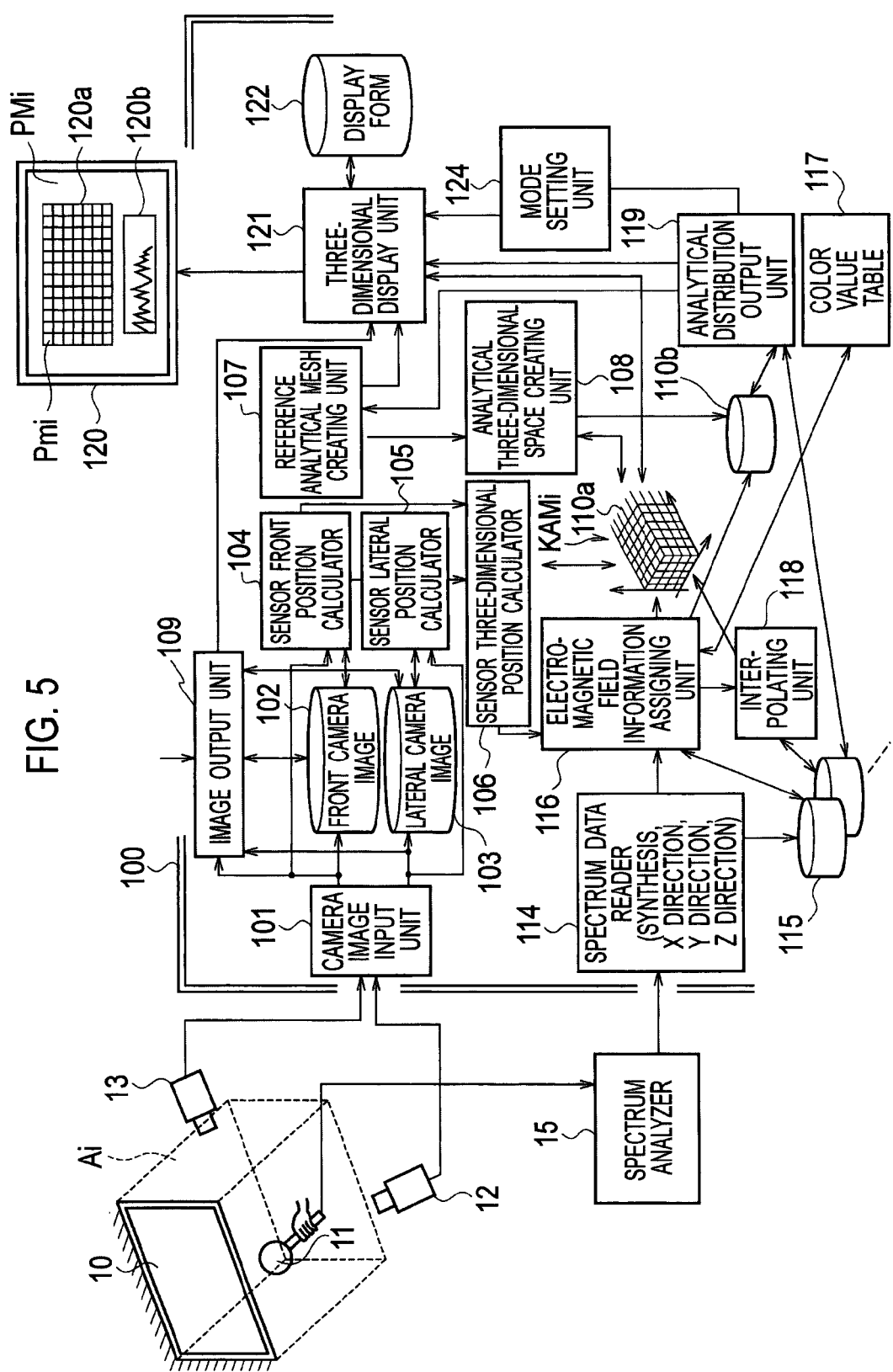
FIG. 5 is an outline configuration diagram of the emission signal visualization device.

FIG. 5 is an outline configuration diagram of the emission signal visualization device of this embodiment. FIG. 3 is a specific connection configuration diagram.

As shown in FIG. 3, the emission signal visualization device of this embodiment is constituted by a sensor 11, a front video camera 12, a lateral video camera 13, a spectrum analyzer 15, and an analyzing body unit 100. In this analyzing body unit 100, a display device 120 to display output results from the analyzing body unit 100 is disposed.

Figure 1:
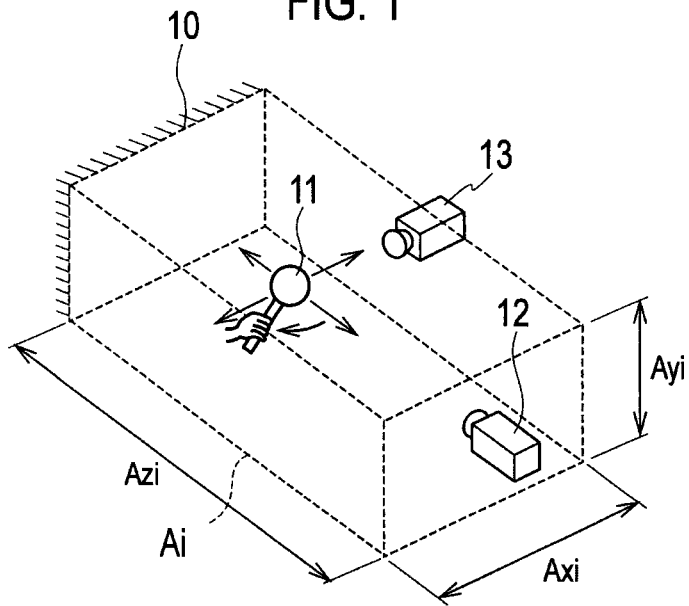
FIG. 1 is an explanatory drawing of a measurement space Ai.

As shown in FIG. 1, a measurer fixes the positional relationship of each of the front video camera 12 and the lateral video camera 13 relative to the measured object 10. Here, the measurer fixes the front video camera 12 so as to photograph the measured object 10 from the front, and fixes the lateral video camera 13 in such a way that the sight line direction of the lateral video camera 13 is made parallel to a direction orthogonal to a sight line direction of the front video camera 10. Hereinafter, the sight line direction of the front video camera 12 is set to a Z axis, the sight line direction of the lateral video camera 13 is set to an X axis, and a direction orthogonal to each of the X axis and the Z axis is set to a Y axis.

The sight line direction of the front video camera 12 is called a front direction, and the sight line direction of the lateral video camera 13 is called a lateral direction. Further, the front video camera 12 is called a first video camera, and the lateral video camera 13 is called a second video camera.

For convenience of the later description, a measurement space Ai is described with reference to FIG. 1.

FIG. 1 shows a measurement space Ai. This measurement space Ai is a region shaped in a rectangular parallelepiped form which exists in a range from a measured surface (may be separated by several centimeters, several tens of centimeters, or about several meters) of the measured object 10 to a position on which the front video camera 12 is placed. A side of the measurement space Ai in the depth direction is parallel to the Z-axis, and a side of the measurement space Ai in the width direction is parallel to the X axis.

This measurement space Ai has a size defined with a depth Azi, a width Axi, and a height Ayi. The depth Azi is the length of a side of the measurement space Ai in the depth direction (the Z axis). The width Axi is the length of a side of the measurement space Ai in the width direction (the X axis). The height Ayi is the length of a side of the measurement space Ai in the height direction (the Y axis).

Here, each of the depth Azi, the width Axi, and the height Ayi is information input by a measurer by opening a screen for inputting a measurement space and by operating a mouse and a keyboard.

Further, information on a relative positional relationship among the measurement space Ai, the front video camera 12, and the lateral video camera 13 is information input by a measurer by opening a screen for inputting a measurement space and by operating a mouse and a keyboard. Alternatively, the information on this relative positional relationship may be information automatically determined by a device.

Further, the front of the measured object 10 is a face made to a front by a measurer, and may be a back face or a side face (a left side, right side, underside, or top) of the measured object 10. That is, a measured plane of the measured object 10 determined by a measurer is made to a front.

A measurer moves a sensor 11 within this measurement space Ai and measures noises. With this operation, a distribution of three-dimensional noises within the measurement space Ai is stored in the emission signal visualization device. Based on the stored information, it becomes possible to analyze noises.

(Configuration of an Emission Signal Visualization Device)

The configuration of an emission signal visualization device is described.

Figure 4:
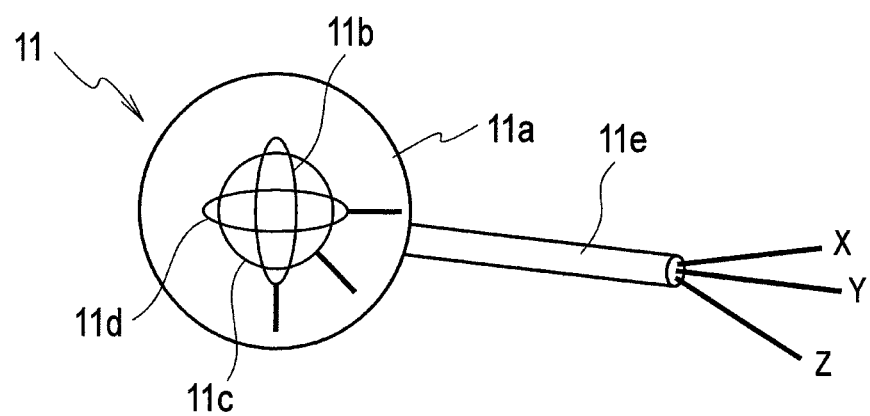
FIG. 4 is an explanatory drawing of a sensor 11.

As shown in FIG. 4, the sensor 11 is provided with antennas orthogonal (the X-axis direction, Y-axis direction, Z-axis direction) to each other inside a spherical case body 11a and outputs an electromagnetic field detection signal in each direction.

Further, to each of these antennas, an amplifier, an output signal line, and a power supply line are connected (not shown). To the case body 11a, a rod 11e having a predetermined length so as to allow a person to hold it by hand is connected.

A spectrum analyzer 15 includes an FFT for X-axis direction, an FFT for Y-axis direction, an FFT for Z-axis direction, a synthesizing unit, etc. (not shown).

The FFT for X-axis direction discretizes and samples electromagnetic field detection signals in the X-axis direction from the sensor 11, and outputs spectrum data (Fourier coefficient) in the X-axis direction from these data.

The FFT for Y-axis direction discretizes and samples electromagnetic field detection signals in the Y-axis direction from the sensor 11, and outputs spectrum data (Fourier coefficient) in the Y-axis direction from these data.

The FFT for Z-axis direction discretizes and samples electromagnetic field detection signals in the Z-axis direction from the sensor 11, and outputs spectrum data (Fourier coefficient) in the Z-axis direction from these data.

The synthesizing unit synthesizes and outputs the respective spectrum data in these axis directions. A measurer selects either direction or whether to output synthesized data.

Next, description is given to the configuration of the analyzing body unit 100 with reference to FIG. 5.

The analyzing body unit 100 includes a camera image input unit 101, a sensor front position calculator 104, a sensor lateral position calculator 105, a sensor three-dimensional position calculator 106, a reference analytical mesh creating unit 107, an analytical three-dimensional space creating unit 108, an image output unit 109, a spectrum data reading unit 114, an electromagnetic field information assigning unit 116, a color value table 117, an interpolating unit 118, an analytical distribution output unit 119, a three-dimensional display unit 121, and a mode setting unit 124.

Further, the analyzing body unit 100 includes various kinds of memories 102, 103, 110a, 110b, 115, and 122. Further, it includes a timer (not shown).

Here, the above-mentioned sensor front position calculator 104, sensor lateral position calculator 105, sensor three-dimensional position calculator 106, reference analytical mesh creating unit 107, analytical three-dimensional space creating unit 108, image output unit 109, electromagnetic field information assigning unit 116, color value table 117, interpolating unit 118, analytical distribution output unit 119, three-dimensional display unit 121, and mode setting unit 124 may be stored in a storage medium (not shown), and read out to a program execution memory (not shown) to execute this process.

The camera image input unit 101 is connected to the front video camera 12 and the lateral video camera 13. The camera image input unit 101 is called an image input unit.

The camera image input unit 101 acquires a video signal from the front video camera 12 for every given time Ti (for example, 1/30 seconds) in accordance with input of a measurement start instruction, converts the video signal into a digital signal, and outputs the digital signal as a front image AGi (also called a first photographed image) to an image output unit 109. Simultaneously, the front image AGi is overwritten and saved in the memory 102.

The camera image input unit 101 acquires a video signal from the lateral video camera 13 for every given time Ti (for example, 1/30 seconds) in accordance with input of the measurement start instruction, converts the video signal into a digital signal, and outputs the digital signal as a lateral image BGi (also called a second photographed image) to the image output unit 109. Simultaneously, the lateral image BGi is overwritten and saved in the memory 103.

Here, it is desirable that the front video camera 12 and the lateral video camera 13 are arranged such that the whole of the measurement space Ai is photographed in the front image AGi and the lateral image BGi. With this arrangement, in a sensor three-dimensional position calculating process described later, it becomes possible to determine the position of the sensor 11 in the measurement space Ai.

The memory 102 and the memory 103 are collectively called a photographed image storage unit. At this time, it is desirable that a photographed image is stored in association with information, such as a location, an object name, and a date which are input by a measurer (collectively referred to as data identification information Rji).

The image output unit 109 outputs the front image AGi or the lateral image BGi from the camera image input unit 101, or the front image AGi (hereinafter, referred to as the registered front image AGir) saved in the memory 102 or the lateral image BGi (hereinafter, referred to as the registered lateral image BGir) in the memory 103 to the three-dimensional display unit 121.

The three-dimensional display unit 121 receives information to be displayed on a screen from the image output unit 109, a later-mentioned reference analytical mesh creating unit 107, and a later-mentioned analytical distribution output unit 119, and displays the received information on a display device 120. At the time of outputting information, the three-dimensional display unit 121 uses a display form stored in the memory 122.

The sensor front position calculator 104 reads in the front image AGi or the registered front image AGir, and determines information relevant to the position of the sensor 11 in terms of the X-axial direction and the Y-axis direction.

The sensor lateral position calculator 105 reads in the lateral image BGi or the registered lateral image BGir, and determines information relevant to the position of the sensor 11 in terms of the Y-axial direction and the Z-axis direction.

The sensor three-dimensional position calculator 106 determines the position of the sensor 11 by using the information from each of the sensor front position calculator 104 and the sensor lateral position calculator 105.

The spectrum data reader 114 reads the spectrum data from a spectrum analyzer 15 for every given time Ti in accordance with input of a measurement start instruction of a measurer. Since a frequency range has been specified by a measurer in advance, the spectrum data reader 114 takes out the spectrum data Hi in the specified frequency range from these spectrum data and outputs the spectrum data Hi to the electromagnetic field information assigning unit 116. For example, the given time Ti is 1/30 seconds, 1/60 seconds, or 1/100 seconds. Further, a signal acquisition number HFi capable of discriminating the given time Ti is added to the spectrum data Hi, and the spectrum data Hi are stored sequentially in the memory 115. Here, at the time of storing in the memory 115, it is desirable to store by adding the above-mentioned data identification information Rji and the signal acquisition number HFi.

The reference analytical mesh creating unit 107 and the analytical three-dimensional space creating unit 108 create a later-mentioned analytical three-dimensional space model KAMi and the section management information MBi of this analytical three-dimensional space model KAMi. The analytical three-dimensional space model KAMi is created in the three-dimensional memory 110a, and the section management information MBi is created in the memory 110b.

These memories 110a, 110b, and 115 are also called a detection signal storage unit.

The reference analytical mesh creating unit 107 creates a later-mentioned screen mesh frame PMi. The screen mesh frame PMi is managed by the three-dimensional display unit 121, and the screen mesh frame PMi is displayed on the display device 120 as a mesh frame for displaying analysis results.

The electromagnetic field information assigning unit 116 reads the information on the position of the sensor 11 determined by the sensor three-dimensional position calculator 106 and the spectrum data Hi from the spectrum data reader 114, and stores the analytical display data Li in the memory 110b.

The interpolating unit 118 operates in conjunction with the electromagnetic field information assigning unit 116.

The analytical distribution output unit 119 invokes analytical display data Li at a position corresponding to a cross section and a prescribed region of the measurement space Ai to be displayed by using the analytical three-dimensional space model KAMi and the section management information MBi. The analytical distribution output unit 119 processes the invoked data in its inside, and outputs the processed result to the three-dimensional display unit 121.

The mode setting unit 124 determines the operation of each of the analytical distribution output unit 119 and the three-dimensional display unit 121 based on the information on the mode specified by a measurer. The measurer can set up a cross section and a prescribed region of the measurement space Ai to be displayed by setting up an analysis type Ki to the mode setting unit 124.

The color value table 117 is a table showing the correspondence relation between colors and signal levels at the time of displaying an electromagnetic field intensity (signal level) in a color. The color value table 117 provides the information on color values Ci to the electromagnetic field information assigning unit 116.

Figure 6:
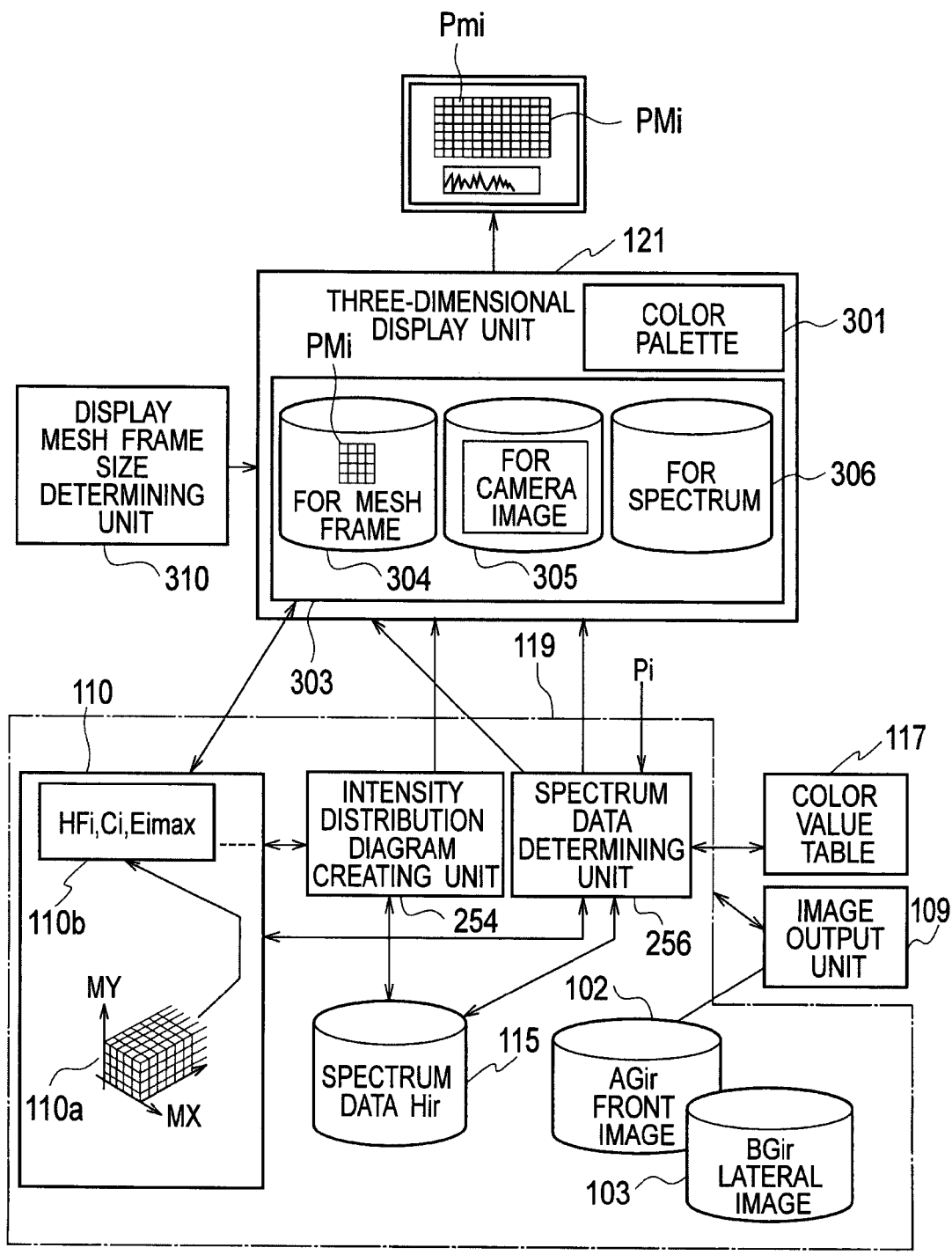
FIG. 6 is an outline configuration diagram of an analytical distribution output unit 119 and a three-dimensional displaying unit 121.

FIG. 6 is an outline configuration diagram which the analytical distribution output unit 119 and the three-dimensional display unit 121 have.

As shown in FIG. 6, the analytical distribution output unit 119 includes an intensity distribution diagram creating unit 254 and a spectrum data determining unit 256.

As shown in FIG. 6, the three-dimensional display unit 121 includes, as an image memory, a memory 304 for displaying a screen mesh frame, a memory 305 for displaying a camera image, and a memory 306 for displaying a spectrum waveform. Further, it includes a color palette 301 corresponding to a color value.

A screen mesh frame PMi created by the reference analytical mesh creating unit 107 is stored in the memory 304 for displaying a screen mesh frame.

Each of the front image AGi, the registered front image AGir, the lateral image BGi, and the registered lateral image BGir which are output from the image output unit 109 is stored in the memory 305 for displaying a camera image.

Further, the three-dimensional display unit 121 reads periodically a screen mesh frame PMi stored in the memory 304 for displaying a screen mesh frame, the memory 305 for displaying a camera image, and the memory 306 for displaying a spectrum waveform, and displays them on a corresponding region (a front image/lateral image displaying region 120a, and a spectrum displaying region 120b).

Furthermore, to the three-dimensional display unit 121, a display mesh frame size determining unit 310 is connected.

The display mesh frame size determining unit 310 changes the size of the screen mesh frame PMi. For example, in order to display the intensity distribution of only a desired region on the measured object 10, the size of the screen mesh frame PMi is changed.

(Analytical Three-Dimensional Space Model KAMi)

Next, the analytical three-dimensional space model KAMi is described with reference to FIG. 2.

Figure 2:
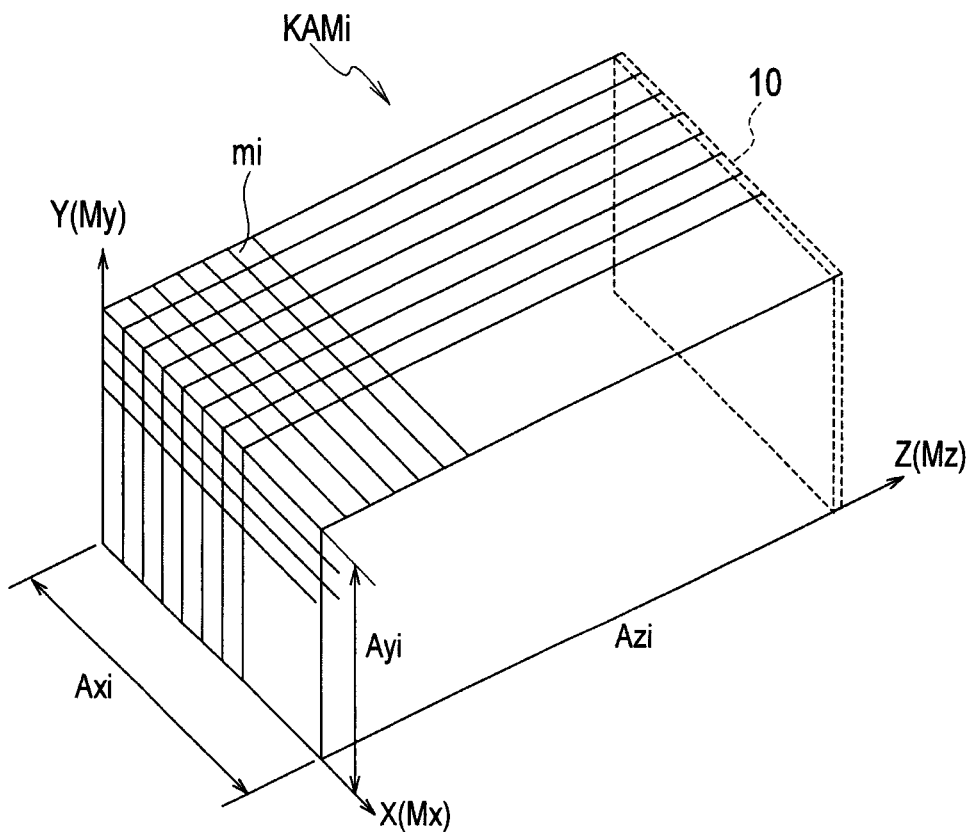
FIG. 2 is an explanatory drawing of an analytical three-dimensional space model KAMi.

As shown in FIG. 2, the analytical three-dimensional space model KAMi is defined as a lattice-shaped mesh in which a measurement space Ai is virtually divided into each of the X axis, the Y axis, and the Z axis at intervals of a lattice size dmi. A Mx axis, a My axis, and a Mz axis of the analytical three-dimensional space model KAMi correspond to the X axis, the Y axis, and the Z axis of the measurement space Ai, respectively. Each section mi in this mesh is uniquely specified by the three-dimensional coordinate (Mxi, Myi, Mzi) in the analytical three-dimensional space model KAMi.

Further, the three-dimensional coordinate (Mxi, Myi, Mzi) in the analytical three-dimensional space model KAMi are uniquely specified by the respective sections mi.

In order to create the analytical three-dimensional space model KAMi, the reference analytical mesh creating unit 107 reads the magnitude of the measurement space Ai and the size dmi (for example, preferably about 10 cm equivalent to the magnitude of a sensor 11) of a section mi which constitutes the mesh. The magnitude of the measurement space Ai and the size dmi of a section mi which constitutes the mesh are set up by a measurer, or are determined by the device. The information on the created analytical three-dimensional space model KAMi is stored in the three-dimensional memory 110*a*.

The analytical three-dimensional space model KAMi is used to determine the position of a sensor 11 in the measurement space Ai, and to determine a section mi.

Here, the analytical three-dimensional space model KAMi may be defined by virtually dividing the measurement space Ai at equal intervals in the respective directions of X-axis, the Y-axis, and the Z-axis, and the interval of the division may be different among the respective directions.

(Section Management Information MBi)

Figure 7:
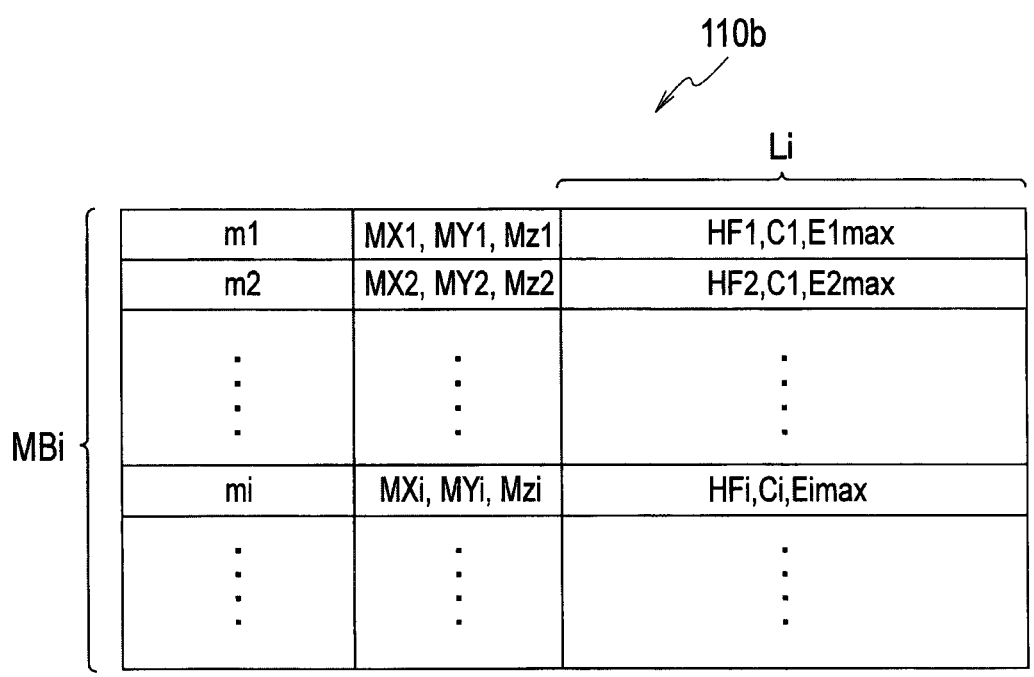
FIG. 7 is an explanatory drawing of a memory 110b.

Next, the section management information MBi is described with reference to FIG. 7.

The section management information MBi is constituted by sections mi, three-dimensional coordinate of each of the sections mi, and analytical display data Li. Furthermore, the analytical display data Li is constituted by the signal acquisition number HFi of the spectrum data Hi of the memory 115*a*, the maximum intensity Eimax of the electromagnetic field which becomes the maximum within the spectrum data Hi, and color values Ci. The color values Ci correspond to the maximum intensity Eimax, and is determined based on the color value table 117.

The electromagnetic field information assigning unit 116 reads the information on the position of the sensor 11 determined by the sensor three-dimensional position calculator 106 and the spectrum data Hi from the spectrum data reader 114 and stores the analytical display data Li in the memory 110*b*. Accordingly, the section management information MBi is updated by the electromagnetic field information assigning unit 116.

The sections mi of the analytical three-dimensional space model KAMi correspond to the pieces of section management information MBi in a one-to-one manner. If a section mi is specified, the stored section management information MBi can be referred to by referring to the memory 110*b*. With this operation, it becomes possible to obtain the information about the electromagnetic field detection signal in a region in the measurement space Ai corresponding to a section mi.

The relationship in which the sections mi of the analytical three-dimensional space model KAMi correspond to the pieces of section management information MBi in a one-to-one manner is managed by the three-dimensional memory 110*a* and the memory 110*b*. In other words, in the analytical three-dimensional space model KAMi defined as a lattice-shaped mesh in which the measurement space Ai is divided into each of the depth direction, the width direction, and the height direction at given intervals, each of the three-dimensional memory 110*a* and memory 110*b* is a memory which stores each of the sections mi of the analytical three-dimensional space model KAMi in association with the section management information MBi including the three-dimensional coordinate (Mxi, Myi, Mzi) of the section mi in the analytical three-dimensional space model KAMi, the detection signal, and the color value Ci of the signal level Eimax becoming the largest in the detection signal.

(Screen Mesh Frame PMi)

Next, the screen mesh frame PMi is described.

Figure 10:
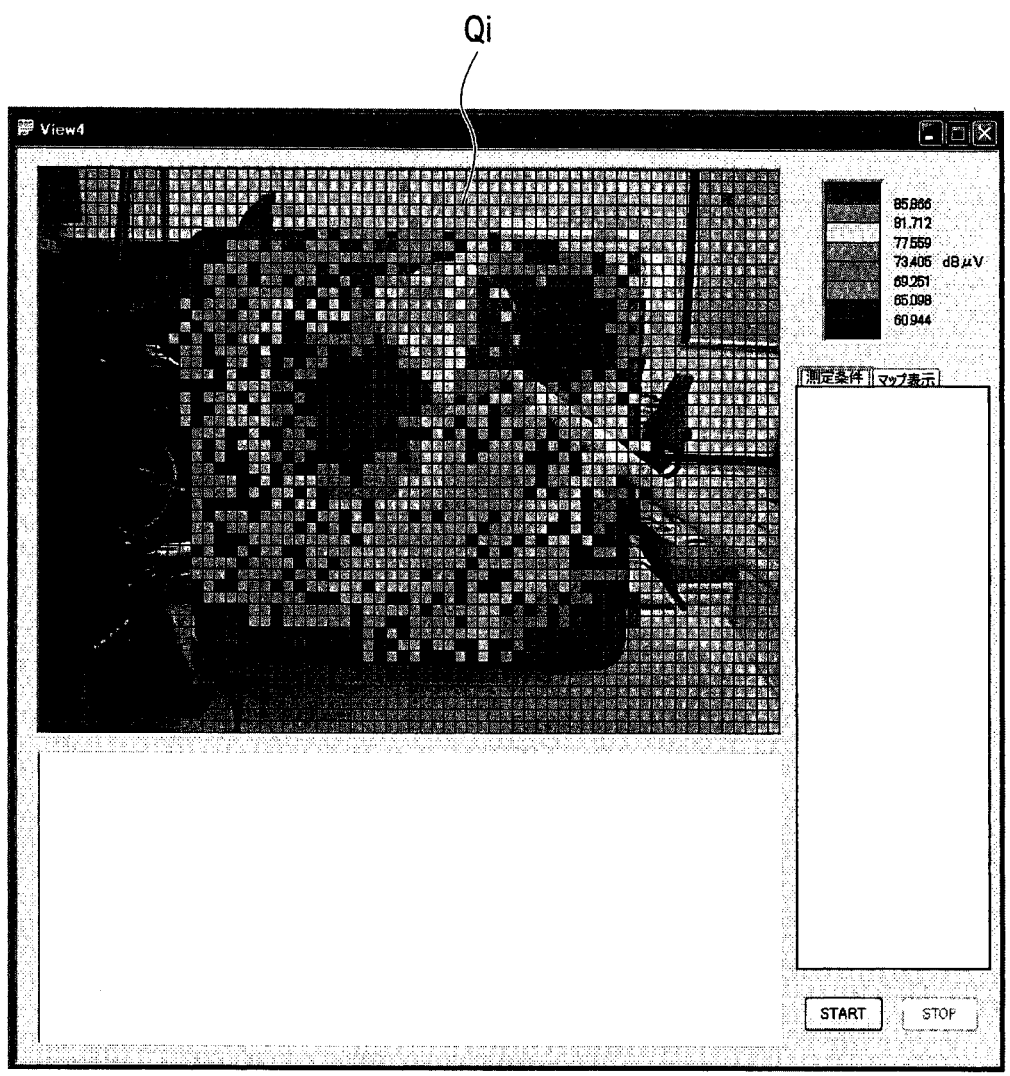
FIG. 10 is an explanatory drawing for illustrating a display screen of the analysis result of this embodiment.

As shown in FIG. 10, the screen mesh frame PMi is a rectangular region displayed on the display device 120. That is, the screen mesh frame PMi is displayed on the display device 120 as a mesh frame for displaying analysis results. By the three-dimensional display unit 121, an intensity distribution diagram Qi of the electromagnetic field intensity (signal level) on a cross section and a prescribed region of the measurement space Ai to be displayed is displayed in a color on the screen mesh frame PMi. When the screen mesh frame PMi is displayed, the screen mesh frame PMi is overlapped and displayed with the front image AGi, the lateral image BGi, the registered front image AGir, or the registered lateral image BGir. When the screen mesh frame PMi is displayed on the display device 120, the screen mesh frame PMi is displayed such that the height direction of the measurement space Ai is made parallel to the height direction of the screen mesh frame PMi.

The size of the screen mesh frame PMi is adapted to be changed by input of a measurer. Further, the screen mesh frame PMi is defined as a lattice-shaped mesh divided in the transverse direction and the height direction. Each of screen sections Pmi of a mesh is displayed based on color values Ci by the three-dimensional display unit 121 in accordance with the information output by the analytical distribution output unit 119.

The screen mesh frame PMi is created by the reference analytical mesh creating unit 107, and is managed by the three-dimensional display unit 121.

When the screen mesh frame PMi is overlappingly displayed with one of the front image AGi and the registered front images AGir, each of the screen sections Pmi of the screen mesh frame PMi is managed in association with one of the sections mi by the two-dimensional coordinate (Mxi, Myi) among the three-dimensional coordinate of the sections mi of the analytical three-dimensional space model KAMi.

When the screen mesh frame PMi is overlapped and displayed with one of the lateral image BGi and the registered lateral images BGir, each of the screen sections Pmi of the screen mesh frame PMi is managed in association with the section mi by the two-dimensional coordinate (Myi, Mzi) among the three-dimensional coordinate of the sections mi of the analytical three-dimensional space model KAMi.

When overlapped and displayed with a photographed image, the section mi and the screen section Pmi which are associated with each other are displayed by being overlapped with each other in the image display region 120*a*.

Here, whether the screen mesh frame PMi is overlapped and displayed with which one of the front image AGi, the lateral image BGi, the registered front image AGir, and the registered lateral image BGir is determined by a measurer by setting a mode of a device. By setting a mode of a device by a measurer, the mode setting unit 124 determines the operation of the three-dimensional display unit 121.

(Mode of the Device)

Hitherto, the description has been given to the constitutional elements of the device and the managed data. Next, description is given to modes which the device may take.

In the emission signal visualization device of this embodiment, there exist a pre-measurement preparation mode (i.e., a preparation mode before measurement), a measuring mode, and a post-registration-completion mode.

In the pre-measurement preparation mode, a measurer opens a screen for inputting a measurement-space and inputs the depth Azi, the width Axi, and the height Ayi of a measurement space Ai. Further, also the measurer opens the screen for inputting a measurement-space and inputs information on the positional relationship among the measurement space Ai, the front video camera 12, and the lateral video camera 13. Furthermore, the measurer also inputs measurement conditions to be set for a spectrum analyzer 15, such as a lower limit frequency and an upper limit frequency.

After the input operation by the measurer has been completed, an analytical three-dimensional space model KAMi is created.

In the measuring mode, the spectrum data reader 114 and the electromagnetic field information assigning unit 116 are actuated, whereby electromagnetic field detection signals from the sensor 11 are analyzed, and analyzed information is stored in the memories 110b and 115.

In the post-registration-completion mode, the spectrum data reader 114 and the electromagnetic field information assigning unit 116 are not actuated, and the information stored in the memories 110b and 115 is not updated.

Whether the emission signal visualization device takes which one mode of the pre-measurement preparation mode, the measuring mode, and the post-registration-completion mode is determined through the mode setting unit 124 by the measurer. Generally, the mode of the device is made to move in the order of the pre-measurement preparation mode, the measuring mode, and the post-registration-completion mode.

Here, in each of the pre-measurement preparation mode, the measuring mode, and the post-registration-completion mode, the analytical distribution output unit 119 takes one of different modes.

In the pre-measurement preparation mode, the analytical distribution output unit 119 is not actuated.

In the measuring mode, the analytical distribution output unit 119 takes only a real time display state.

In the post-registration-completion mode, the analytical distribution output unit 119 takes two kinds of states of an analysis displaying state with a single distance and an intensity analyzing state with a specified distance range.

In the post-registration-completion mode, whether the analytical distribution output unit 119 takes which one of the analysis displaying state with a single distance and the intensity analyzing state with a specified distance range is determined through the mode setting unit 124 by the measurer.

In addition, in the emission signal visualization device of this embodiment, there exist a front displaying state and a lateral displaying state as a display mode for the display device 120.

Whether the emission signal visualization device takes which one of the front displaying state and the lateral displaying state is determined through the mode setting unit 124 by the measurer.

Hereinafter, supplemental description is given to operations in each mode.

At the time of the pre-measurement preparation mode or the measuring mode, the sensor front position calculator 104 reads the front image AGi, and the sensor lateral position calculator 105 reads the lateral image BGi.

At the time of the post-registration-completion mode, the sensor front position calculator 104 reads the registered front image AGir, and the sensor lateral position calculator 105 reads the registered lateral image BGir.

In the pre-measurement preparation mode or the measuring mode, at the time of the front displaying state, the image output unit 109 outputs the front image AGi to the three-dimensional display unit 121. Therefore, at this time, the screen mesh frame PMi is overlapped and displayed with the front image AGi.

In the pre-measurement preparation mode or the measuring mode, at the time of the lateral displaying state, the image output unit 109 outputs the lateral image BGi to the three-dimensional display unit 121. Therefore, at this time, the screen mesh frame PMi is overlapped and displayed with the lateral image BGi.

In the post-registration-completion mode, at the time of the front displaying state, the image output unit 109 outputs the registered front image AGir to the three-dimensional display unit 121. Therefore, at this time, the screen mesh frame PMi is overlapped and displayed with the registered front image AGir.

In the post-registration-completion mode, at the time of the lateral displaying state, the image output unit 109 outputs the registered lateral image BGir to the three-dimensional display unit 121. Therefore, at this time, the screen mesh frame PMi is overlapped and displayed with the registered lateral image BGir.

Here, in the front displaying state, on the screen mesh frame PMi, displayed is an intensity distribution diagram Qi corresponding to a cross section made when the measurement space Ai is cut at an x-y face. That is, each of the screen sections Pmi of the screen mesh frame PMi is managed in association with the two-dimensional coordinate (Mxi, Myi) among the three-dimensional coordinate (Mxi, Myi, Mzi) of one of the sections mi of the analytical three-dimensional space model KAMi which overlaps with the screen section Pmi.

Further, in the lateral displaying state, on the screen mesh frame PMi, displayed is an intensity distribution diagram Qi corresponding to a cross section made when the measurement space Ai is cut at a y-z face. That is, each of the screen sections Pmi of the screen mesh frame PMi is managed in association with the two-dimensional coordinate (Myi, Mzi) among the three-dimensional coordinate (Mxi, Myi, Mzi) of one of the sections mi of the analytical three-dimensional space model KAMi which overlaps with the screen section Pmi.

The mode setting unit 124 determines operations of each of the analytical distribution output unit 119 and the three-dimensional display unit 121 as mentioned above based on the information on a mode which a measurer specifies.

Hereinafter, description is given to operations of the emission signal visualization device constituted as mentioned above.

<Operations in the Pre-Measurement Preparation Mode>

Processes before measurement are described.

Figure 8:
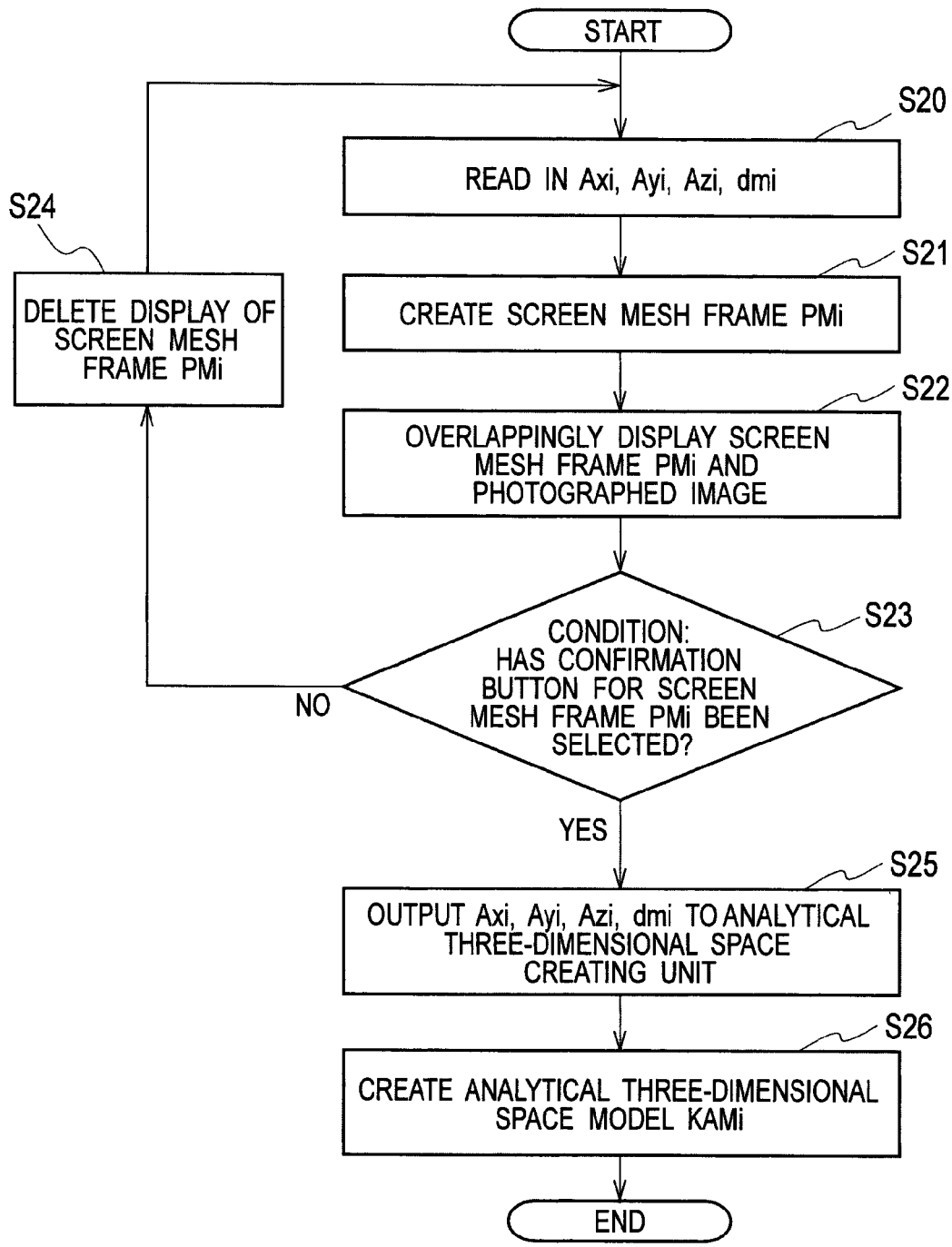
FIG. 8 is a flowchart for illustrating a three-dimensional mesh frame creating process.

FIG. 8 is a flowchart illustrating processes (collectively called a three-dimensional mesh frame creating process) of the reference analytical mesh creating unit 107 and the analytical three-dimensional space creating unit 108.

The three-dimensional mesh frame creating process is performed before measurement.

The reference analytical mesh creating unit 107 makes the screen of the display device 120 display a not-shown mesh frame setting screen and reads the height Ayi of the measurement space Ai for creating the analytical three-dimensional space model KAMi input on the mesh frame setting screen, the depth Azi of the measurement space Ai, the width Axi of the measurement space Ai, and the size dmi of sections mi of the analytical three-dimensional space model KAMi (S20).

Next, the reference analytical mesh creating unit 107 creates a screen mesh frame PMi (S21).

Here, the front video camera 12 photographs the measurement space Ai from the front, and the lateral video camera 13 photographs the measurement space Ai from a lateral. The camera image input unit 101 acquires these photographed images, and the image output unit 109 selects the front image AGi or the lateral image BGi, and displays the selected image on the image display region 120a of the display device 120.

Here, at the time of a front displaying state, the three-dimensional display unit 121 overlaps and displays the screen mesh frame PMi with the front image AGi. On the other hand, at the time of a lateral displaying state, the three-dimensional display unit 121 overlaps and displays the screen mesh frame PMi with the lateral image BGi (S22).

At this time, a confirmation change input screen (not shown) of a screen mesh frame PMi setting is displayed (for example, the right end). The confirmation change input screen of the screen mesh frame PMi setting is composed of, for example, boxes of the size dmi of a section, the transverse width Axi, the longitudinal width Ayi, the depth Azi, a confirmation button, and a change button.

Since the above-mentioned screen mesh frame PMi is created on the basis of the size dmi of the screen section Pmi, there may be a case where the screen mesh frame PMi becomes a screen mesh frame PMi which does not satisfy the transverse width Axi, the longitudinal width Ayi, and depth Azi.

Next, it is judged whether the confirmation button of the screen mesh frame PMi has been selected (S23). When it is judged that the change button has been selected at Step S23, the screen mesh frame PMi displayed on the display device 120 is eliminated by the three-dimensional display unit 121 (S24). Then, the process is returned to Step S20.

In Step S23, when it is judged that the confirmation button has been selected, the transverse width Axi, the longitudinal width Ayi, the depth Azi, and the size dmi of the screen section Pmi are output to the analytical three-dimensional space creating unit 108 (S25).

Next, the analytical three-dimensional space creating unit 108 creates an analytical three-dimensional space model KAMi shown in FIG. 2 by using the transverse width Axi, the longitudinal width Ayi, the depth Azi, and the size dmi of the screen section Pmi output from the reference analytical mesh creating unit 107, and stores it in the three-dimensional memory 110a. Further, as shown in FIG. 7, in the memory 110b, the section management information MBi which associates sections mi with the three-dimensional coordinate (Mxi, Myi, Mzi) of the section mi is created (S26).

Since the three-dimensional mesh frame creating process is performed before measurement, analytical display data Li are not registered in the section management information MBi created by the three-dimensional mesh frame creating process.

The above-mentioned three-dimensional coordinate may be constituted with the coordinate (Mximin, Myimin, Mzimin) of the minimum point of the sections mi and the coordinate (Mximax, Myimax, Mzimax) of the maximum point.

Here, the three-dimensional memory 110a and the memory 110b may be made into a single memory.

<Operations in the Measuring Mode>
(Outline Description of the Operations)

Next, the outline of the operation during the measurement is described with reference to a flowchart shown in FIG. 9. That is, the operations on the measuring mode are described. Here, in FIG. 9, it is assumed that the analytical three-dimensional space model KAMi has already been created.

A measurer selects a measurement start button (not shown) displayed on a screen, and starts the front video camera 12 and the lateral video camera 13. Then, as shown in FIG. 1, the measurer holds the sensor 11 by the hand, and moves the sensor 11 within the measurement space Ai (S1). At this time, the sensor 11 is made to scan (move) upward, downward, rightward and leftward in the measurement space Ai.

Figure 9:
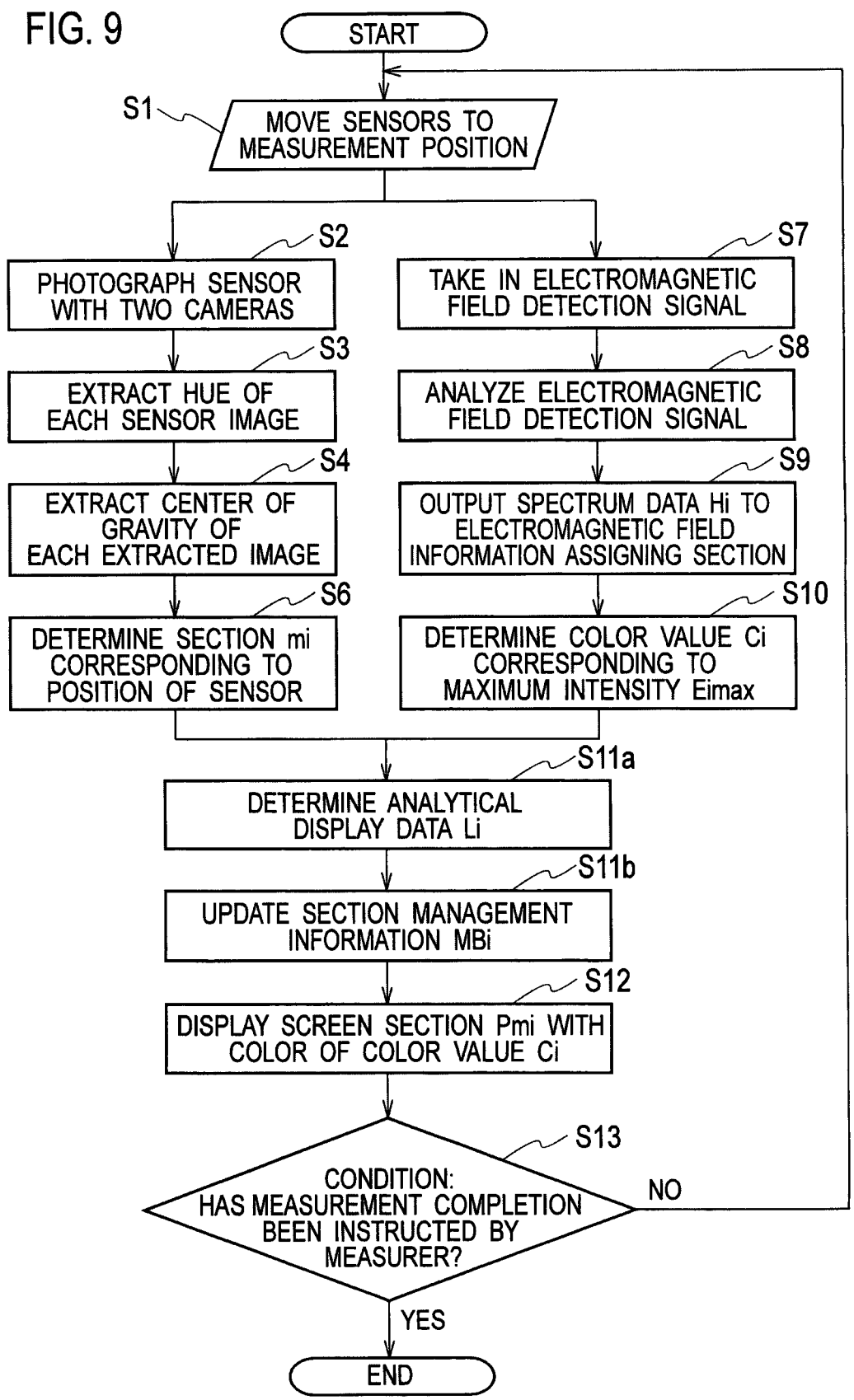
FIG. 9 is a flowchart for illustrating the outline operations of an emission signal visualization device of this embodiment.

With this move, the analyzing body unit 100 is performing paratactic processes shown in FIG. 9.

The front video camera 12 photographs the measurement space Ai from the front, and the lateral video camera 13 photographs the measurement space Ai from a lateral. The camera image input unit 101 acquires these photographed images, and the image output unit 109 selects the front image AGi or the lateral image BGi, and displays the selected image on the image display region 120a of the display device 120 (S2).

Here, at the time of a front displaying state, the three-dimensional display unit 121 makes the image display region 120a display the front image AGi. On the other hand, at the time of a lateral displaying state, the three-dimensional display unit 121 makes the image display region 120a display the lateral image BGi.

In the specific process at Step S2, the camera image input unit 101 performs digital conversion for video signals from the front video camera 12 for every given time (for example, 1/30 seconds), and stores the front image AGi in the memory 102. Simultaneously, the camera image input unit 101 performs digital conversion for video signals from the lateral video camera 13, and stores the lateral image BGi in the memory 103.

Next, the sensor front position calculator 104 extracts the color information (for example, yellow) of the hue, saturation, and lightness of the sensor 11 from the front image AGi, and obtains a sensor front image Gai. Simultaneously, the sensor lateral position calculator 105 extracts the color information (for example, yellow) of the hue, saturation, and lightness of the sensor 11 from the lateral image BGi, and obtains a sensor lateral image Gbi (S3).

The center of the sensor front image Gai is obtained as the center of gravity gai, and simultaneously, the center of the sensor lateral image Gbi is obtained as the center of gravity gbi (S4).

Successively, the sensor three-dimensional position calculator 106 determines sections mi in an analytical three-dimensional space model KAMi by using the center of gravity gai and the center of gravity gbi (S6).

On the other hand, the spectrum analyzer 15 acquires electromagnetic field detection signals detected by the sensor 11 (S7).

The spectrum analyzer 15 analyzes the acquired electromagnetic field detection signal (S8). In concrete terms, the spectrum analyzer 15 obtains the spectrum data in each axis direction by using the FFT for X-axis direction, the FFT for Y-axis direction, and the FFT for Z-axis direction, specifically. That is, the spectrum analyzer 15 obtains the intensity of signals in each frequency of electromagnetic field detection signals. Further, the spectrum analyzer 15 synthesizes the spectrum data in each axis direction, and obtains the synthesized spectrum data.

Successively, the spectrum data reader 114 receives the spectrum data in each axis direction and the synthesized spectrum data from the spectrum analyzer 15. Further, the spectrum data reader 114 makes the memory 115 store the received spectrum data, and simultaneously, outputs one of the received spectrum data to the electromagnetic field information assigning unit 116 as spectrum data Hi (S9).

Which one of the spectrum data in each axis direction and the synthesized spectrum data to be output as the spectrum data Hi to the electromagnetic field information assigning unit 116 may be made to be selected by a measurer.

At this time, a signal acquisition number HFi is generated by a random number generator or a hash value generator (not shown), added to the spectrum data Hi, and stored in the memory 115. The signal acquisition number HFi is generated as a unique number so that the stored spectrum data Hi can be identified from each other.

Next, the electromagnetic field information assigning unit 116 reads in the maximum intensity Eimax in the spectrum data Hi from the spectrum data reader 114. Further, based on the color value table 117, the color value Ci corresponding to this maximum intensity Eimax is determined (S10).

Then, the electromagnetic field information assigning unit 116 obtains the maximum intensity Eimax defined at Step S6, the color value Ci, and the signal acquisition number HFi of the spectrum data Hi as analytical display data Li (S11a).

Next, the electromagnetic field information assigning unit 116 updates the section management information MBi of the memory 110b by using the sections mi, the three-dimensional coordinate (Mxi, Myi, Mzi) of the sections mi, and the analytical display data Li (S11b).

Next, the analytical distribution output unit 119 outputs the color value Ci of the analytical display data Li of sections mi corresponding to a cross section and a given region of the measurement space Ai made as a display object and the three-dimensional coordinate (Mxi, Myi, Mzi) of the sections mi to the three-dimensional display unit 121. At the time of overlappingly displaying with a photographed image, the three-dimensional display unit 121 displays a screen section Pmi of the screen mesh frame PMi overlapped with a section mi by the color of the color value Ci (S12).

When the mode of the emission signal visualization device is the measuring mode, the analytical distribution output unit 119 takes a real time display state.

It is judged whether measurement completion is instructed by a measurer (S13).

When the measurement completion is instructed by the measurer, the process is made to end. On the other hand, when the measurement completion is not instructed, the process is made to return again to Step S1.

That is, as shown in FIG. 10, an intensity distribution diagram is overlappingly displayed with the front image AGi or the lateral image BGi.

(Outline Description of the Operations)

Next, the process of each section is described in detail.
(Sensor Three-Dimensional Position Calculating Process)

Figure 11:
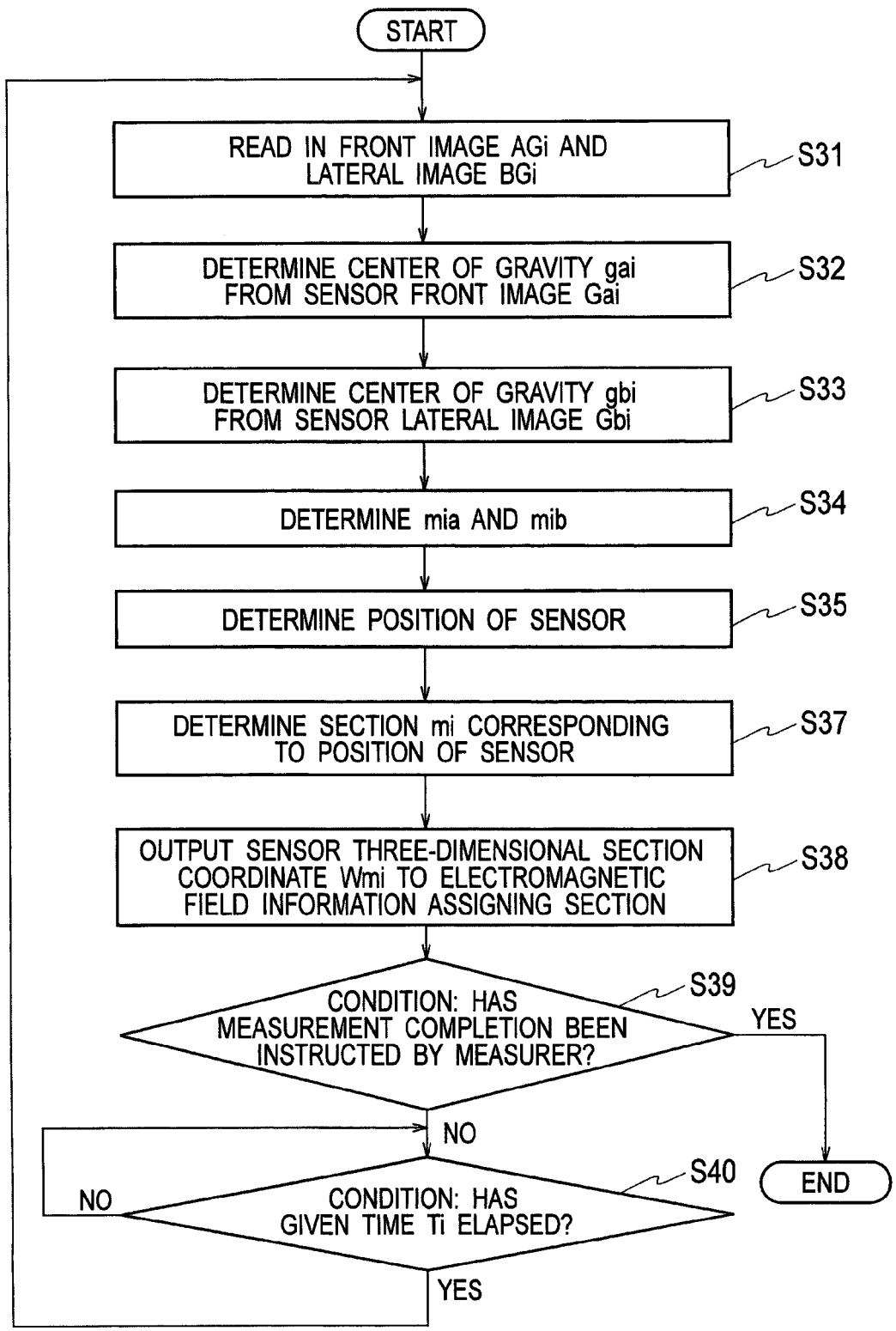
FIG. 11 is a flowchart for illustrating a sensor three-dimensional position calculating process.

Step S3, S4, and S6 in the flowchart shown in FIG. 9 are called a sensor three-dimensional position calculating process. The processing of each of the sensor front position calculator 104, the sensor lateral position calculator 105, and the sensor three-dimensional position calculator 106 is described with reference to the flowchart of FIG. 11.

Figure 12A:
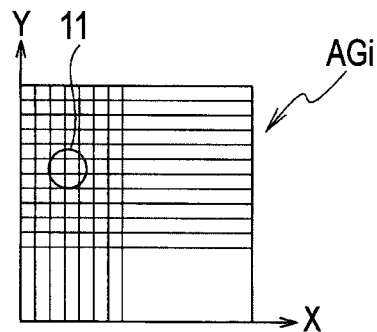
FIG. 12A is explanatory drawing of a front image AGi.
Figure 12B:
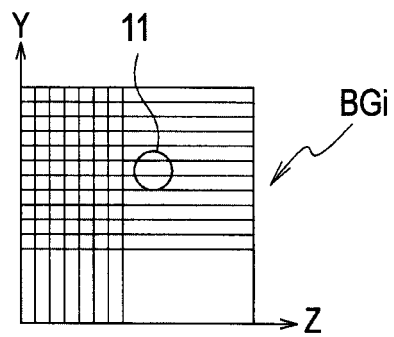
FIG. 12B is explanatory drawing of a sensor lateral image Gbi.

With the selection of a measurement start button, as shown in FIG. 12A, the sensor front position calculator 104 reads in the front image AGi stored in the memory 102. With the selection of a measurement start button, as shown in FIG. 12B, the sensor lateral position calculator 105 reads in the lateral image BGi in the memory 103 (S31).

Figure 13A:
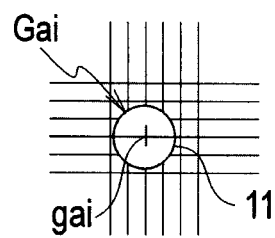
FIG. 13A is explanatory drawing illustrating calculation of a center of gravity.

Next, as shown in FIG. 13A, the sensor front position calculator 104 sets a cluster of a pixel group having, for example, yellow color information (hue, saturation, or lightness) in the front image AGi to a sensor front image Gai, and the center of this sensor front image Gai is obtained as a center of gravity gai (S32).

Here, in place of the center of the sensor front image Gai, the geometric center of the sensor front image Gai may be obtained as a center of gravity gai.

Figure 13B:
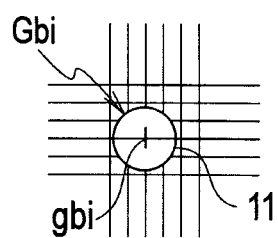
FIG. 13B is explanatory drawing illustrating calculation of a center of gravity.

Next, as shown in FIG. 13B, the sensor lateral position calculator 105 sets a cluster of a pixel group having, for example, yellow color information (hue, saturation, or lightness) in the front image BGi to a sensor lateral image Gbi, and the center of this sensor lateral image Gbi is obtained as a center of gravity gbi (S33).

Here, in place of the center of the sensor lateral image Gbi, the geometric center of the sensor lateral image Gbi may be obtained as a center of gravity gbi.

It is to be noted that each of the center of gravity gai and the center of gravity gbi is a pixel location on a photographed image. Here, the positional relationship among the measurement space Ai, the front video camera 12, and the lateral video camera 13 has been known by the information which the measurer has input at the time of start of measurement. Accordingly, by using the information on the positional relationship, a point mia on the front of the measurement space Ai corresponding to the center of gravity gai and a point mib on the lateral of the measurement space Ai corresponding to the center of gravity gbi are calculated (S34).

The sensor three-dimensional position calculator 106 calculates a intersecting point between a straight line connecting the point mia on the front of the measurement space Ai corresponding to the center of gravity gai and the location where the front video camera 12 exists and a straight line connecting the point mib on the lateral of the measurement space Ai corresponding to the center of gravity gbi and the location where the lateral video camera 13 exists, whereby the position of the sensor 11 in the measurement space Ai is determined (S35).

Next, by using the analytical three-dimensional space model KAMi, the sensor three-dimensional position calculator 106 determines sections mi of the analytical three-dimensional space model KAMi including the determined location of the sensor 11 (S37).

Successively, when the sections mi are determined, the three-dimensional coordinate (Mxi, Myi, Mzi) of the sections mi are determined uniquely. Accordingly, the three-dimensional coordinate of the determined sections are output to the electromagnetic field information assigning unit 116 as sensor three-dimensional section coordinate Wmi (Mxi, Myi, Mzi) (S38).

Next, it is judged whether the instruction of measurement completion has been given by a measurer (S39). When the instruction of measurement completion has not been given, it is further judged whether the given time Ti (for example, 1/30 seconds) has elapsed (S40). When the given time Ti has elapsed, the process is made to return to Step S31. When the given time Ti has not elapsed, the process again enters a waiting state, and is made to return to Step S40.

Namely, for the every given time Ti, when the sensor 11 has scanned (moved) upward and downward, rightward and leftward, and forward and backward in the measurement space Ai, the sensor three-dimensional section coordinate Wmi (Mxi, Myi, Mzi) in the analytical three-dimensional space model KAMi are notified to the electromagnetic field information assigning unit 116.

(Electromagnetic Field Information Assigning Process)

Figure 14:
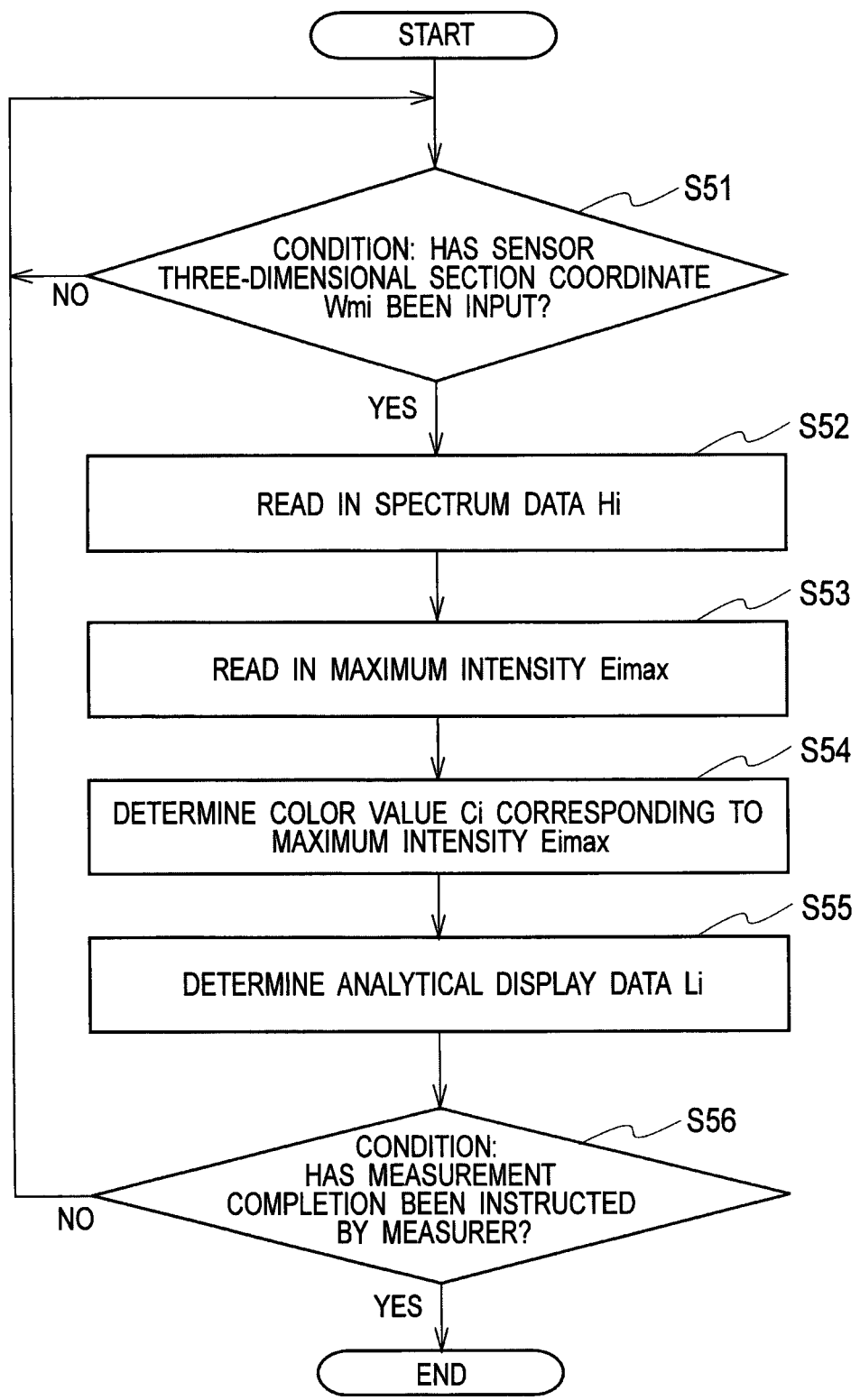
FIG. 14 is a flowchart illustrating an electromagnetic field information assigning process.

Step S7, S8, S9, and S10 in the flowchart shown in FIG. 9 are called an electromagnetic field information assigning process. The processing of the electromagnetic field information assigning unit 116 is described with reference to the flowchart shown in FIG. 14. However, in this embodiment, it is assumed that, with the input of measurement start instruction, the spectrum data reader 114 adds the signal acquisition number HFi to the spectrum data Hi (refer to FIG. 14) from the spectrum analyzer 15 for every the given time Ti and makes the memory 115a store them.

With the input of measurement start instruction, the electromagnetic field information assigning unit 116 judges whether the sensor three-dimensional section coordinate Wmi (Mxi, Myi, Mzi) has been input from the sensor three-dimensional position calculator 106 (S51).

In Step S51, when it is judged that the sensor three-dimensional section coordinate Wmi (Mxi, Myi, Mzi) has been input, the spectrum data Hi are read in (S52).

Then, the electromagnetic field information assigning unit 116 reads the maximum intensity Eimax in the spectrum data Hi (S53).

Next, the color value Ci corresponding to the maximum intensity Eimax in the spectrum data Hi is determined from the color value table 117 (S54).

Next, as section management information MBi corresponding to the sections mi of the analytical three-dimensional space model KAMi shown by the sensor three-dimensional section coordinate Wmi (Mxi, Myi, Mzi) having been input, the signal acquisition number HFi, the maximum intensity Eimax, and the color value Ci of the spectrum data Hi and the analytical display data Li are stored in the memory 110b (S55).

Next, it is judged whether the instruction of measurement completion has been given, and when the instruction of measurement completion has not been given, the process is made to return to Step S51 (S56).

Until the instruction of measurement completion has been given by the measurer, the electromagnetic field information assigning process is repeated such that sections mi are determined by the sensor three-dimensional position calculating process correspondingly to the location of the sensor 11, and analytical display data Li are stored as the section management information MBi corresponding to the sections mi in the memory 110b.

Therefore, during the given time Ti when the sensor 11 has scanned (moved) upward and downward, rightward and leftward, and forward and backward in the measurement space Ai, the spectrum data Hi is allocated sequentially for each of the sections mi of the analytical three-dimensional space model KAMi.

(Processing of the Analytical Distribution Output Unit)

Figure 15:
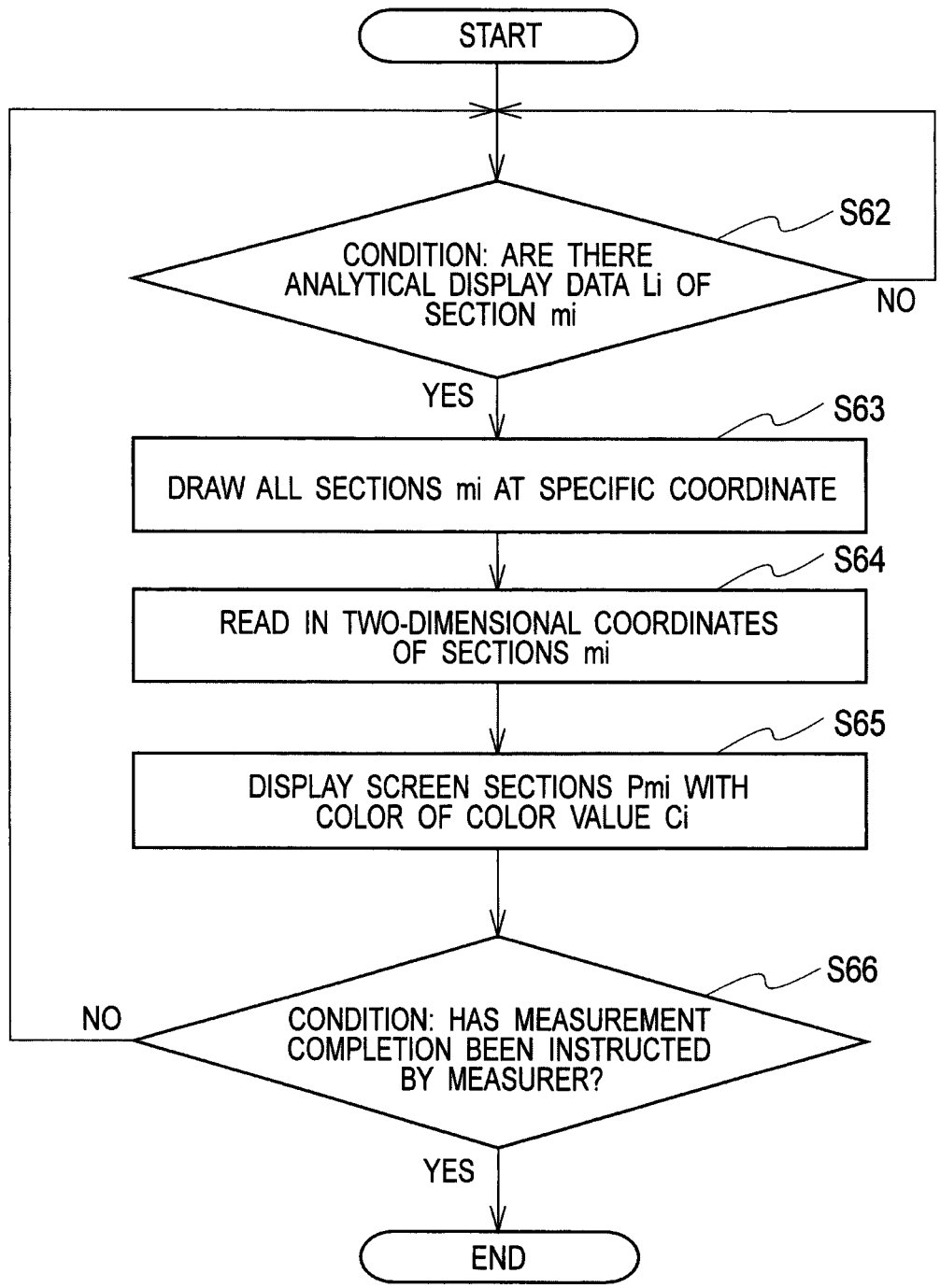
FIG. 15 is a flowchart illustrating operations of an analytical distribution output unit 119 in a measuring mode.

FIG. 15 is a flowchart illustrating operations when the analytical distribution output unit 119 is in a real time display state.

During measurement, by the later-mentioned processing of the analytical distribution output unit 119, the electromagnetic field detection signals measured by the sensor 11 are analyzed in real time, and an intensity distribution diagram Qi of electromagnetic field intensity (signal level) is displayed on the display device 120.

The intensity distribution diagram creating unit 254 judges whether the analytical display data Li (the signal acquisition number HFi, the color value Ci, and the maximum intensity (Eimax) in the spectrum data Hi) have been allocated to the sections mi of the analytical three-dimensional space model KAMi (S62).

In Step S62, when it is judged that the analytical display data Li have been allocated, the following processes after Step S63 are performed.

At the time of a front displaying state, the intensity distribution diagram creating unit 254 draws all sections mi having the Mzi coordinate of the same analytical three-dimensional space model KAMi as the sections mi to which the analytical display data Li are allocated. On the other hand, at the time of a lateral displaying state, the intensity distribution diagram creating unit 254 draws all sections mi having the Mxi coordinate of the same analytical three-dimensional space model KAMi as the sections mi to which the analytical display data Li are allocated (S63).

Then, with regard to all the drawn sections mi, the intensity distribution diagram creating unit 254 reads the two-dimensional coordinate of each of the section mi (S64). Next, the color values Ci and the two-dimensional coordinate allocated to each of the sections mi are output to the three-dimensional display unit 121, and the screen sections Pmi associated with the two-dimensional coordinate are displayed with the color of the color values Ci (S65).

In more concrete terms, at the time of a front displaying state, the three-dimensional display unit 121 displays the screen section Pmi corresponding to the two-dimensional coordinate (Mxi, Myi) with the color of the color values Ci. At the time of a lateral displaying state, the three-dimensional display unit 121 displays the screen section Pmi corresponding to the two-dimensional coordinate (Myi, Mzi) with the color of the color values Ci.

Here, the three-dimensional display unit 121 reads in periodically the memory 304 storing screen sections Pmi and the color of color value Ci for displaying a mesh frame, the memory 305 for displaying camera images, and the memory 306 for displaying spectrum waveforms, and displays information on the display device 120.

That is, an intensity distribution diagram Qi corresponding to the maximum intensity Eimax as shown in FIG. 10 on the cross section containing the section mi corresponding to the position of the sensor 11 is displayed in real time on the display device 120. It becomes possible for a measurer to acquire spectrum data without omission while observing this screen.

Next, it is judged whether the instruction of measurement completion has been given by a measurer (S66). When the instruction of measurement completion has not been given, the process is made to return to Step S62. On the other hand, when the instruction of measurement completion has been given, the process is made to end.

Accordingly, by observing this screen, the measurer can understand at a glance the situation that noises with high electromagnetic field intensity (signal level) has occurred on which region.

In addition, when the instruction of measurement completion has been given by the measurer, the interpolating unit 118 judges whether the spectrum data Hi are assigned to each of the sections mi of the analytical three-dimensional space model Ami. For a not-assigned section mi, the interpolating unit 118 interpolates the spectrum data Hi of the section mi of the mesh frame from the spectrum data Hi assigned to the front, rear, right and left side sections mi on the lattice-shaped mesh of the analytical three-dimensional space model KAMi.

Figure 16A:
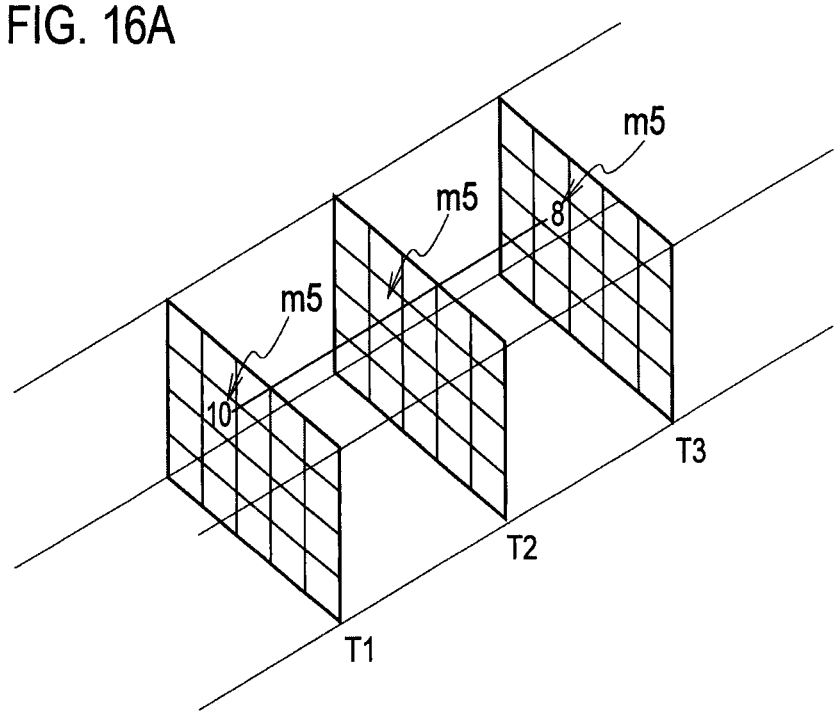
FIG. 16A is explanatory drawing illustrating processing of an interpolating unit.
Figure 16B:
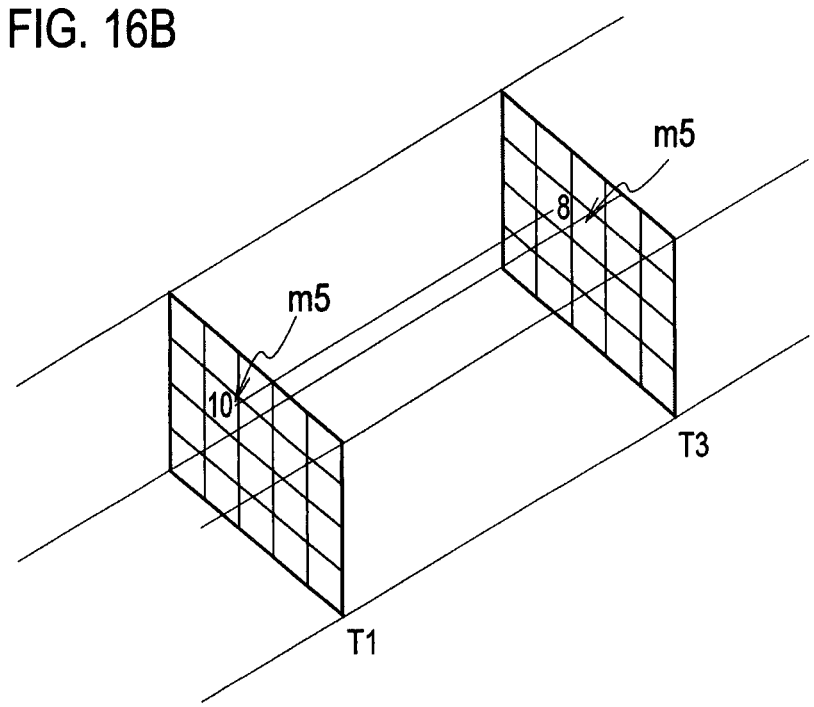
FIG. 16B is explanatory drawing illustrating processing of an interpolating unit.

For example, as shown in FIG. 16A, in the case where spectrum data Hi with "10: for example, in intensity" was assigned to m5 at time T1 and no spectrum data Hi was assigned to m5 at time T2, if spectrum data Hi with "8: for example, in intensity" was assigned to m5 at time T3, as shown in FIG. 16B, spectrum data Hi with "8" is assigned to m5 at time T2.

Here, the interpolating units 118 is not an indispensable constitutional element. It is assumed that the interpolating units 118 is actuated upon receipt of an interpolation instruction.

<Operations in the Post Registration Completion Mode>

Next, operations in the post registration completion mode are described.

In the post registration completion mode, analysis processing is performed for the analytical display data Li stored in the memory 110b in the measuring mode and the spectrum data Hi which includes the added signal acquisition number HFi and is stored in the memory 115.

The analyses of the analytical display data Li stored in the memory 110b is performed by the intensity distribution diagram creating unit 254 of the analytical distribution output unit 119, and the analyses of the spectrum data Hi including the added signal acquisition number HFi and stored in the memory 115 is performed by the spectrum data determining unit 256 of the analytical distribution output unit 119.

When setting a device to the post registration completion mode through the mode setting unit 124, a measurer specifies an analysis type Ki as a parameter to determine the operations of the intensity distribution creating unit 254 of the analytical distribution output unit 119. The analysis type Ki includes a parameter: distance di to specify the position of a cross section in the measurement space Ai.

In the post registration completion mode, the analytical distribution output unit 119 takes two kinds of states of an analysis displaying state with a single distance and an intensity analyzing state in a specified distance range. Accordingly, hereinafter, description is separately given to the content of processing in the analytical distribution output unit 119 for each of the states.

(Processing of the Analytical Distribution Output Unit 119 in the Analysis Displaying State with a Single Distance)

Figure 17:
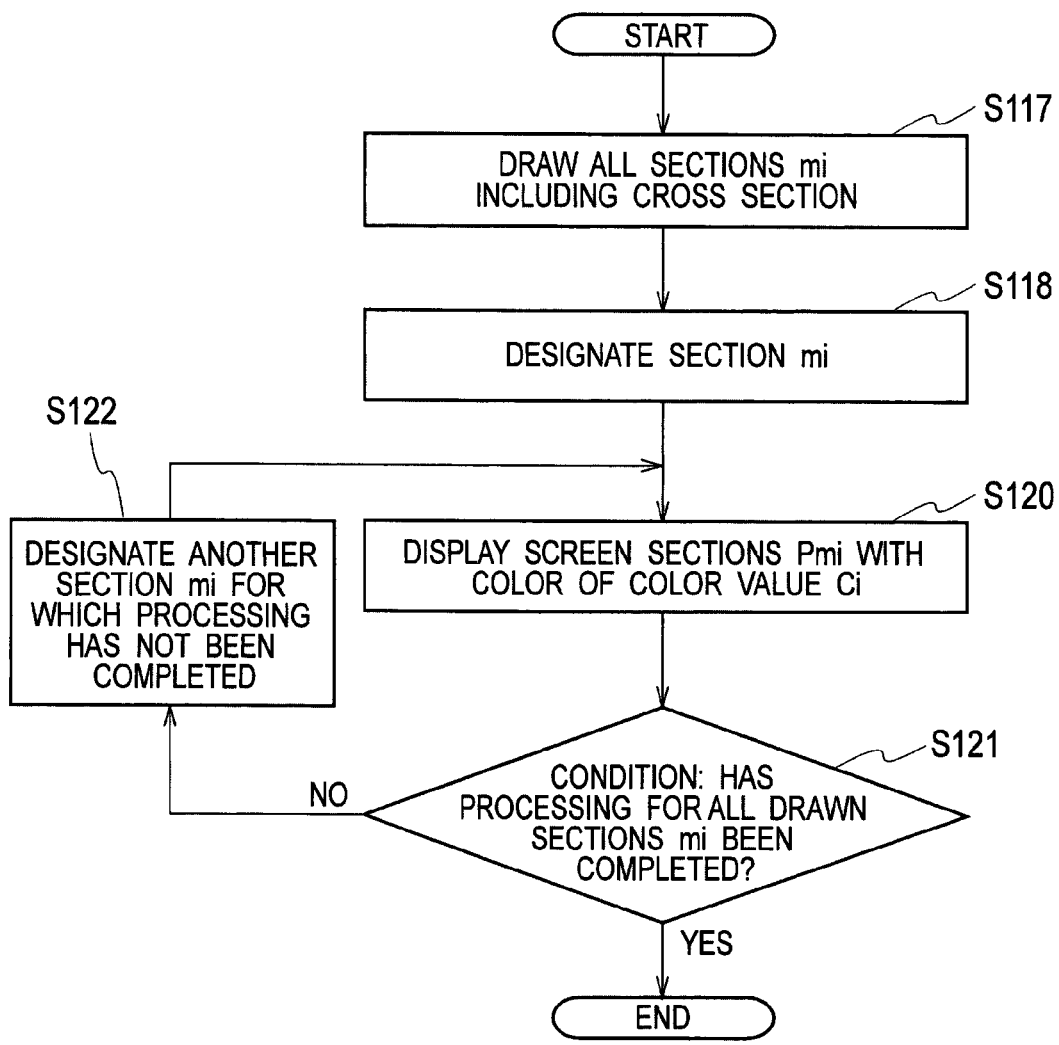
FIG. 17 is a flowchart illustrating operations when an analytical distribution output unit 119 is in an analysis displaying state with a single distance.

FIG. 17 is a flowchart illustrating operations in the case where the analytical distribution output unit 119 is in the analysis displaying state with a single distance.

A measurer specifies only one value as a distance di.

In the front displaying state, the intensity distribution creating unit 254 performs processing for displaying an intensity distribution diagram Qi corresponding to a cross section of the measurement space Ai defined with a face on which a Z-axis coordinate specified with a distance di is constant.

In the lateral displaying state, the intensity distribution creating unit 254 performs processing for displaying an intensity distribution diagram Qi corresponding to a cross section of the measurement space Ai defined with a face on which an X-axis coordinate specified with a distance di is constant.

Although the distance di is defined as a factor representing the Z-axis coordinate or the X-axis coordinate, the distance di may be defined as a distance from the front of the measurement space Ai, or a distance from the lateral of the measurement space Ai.

The intensity distribution diagram creating unit 254 draws up all sections mi containing the cross section of the measurement space Ai specified with the distance di (S117).

Then, the intensity distribution diagram creating unit 254 specifies one of all the drawn sections mi (S118).

The color value Ci and two-dimensional coordinate both assigned to the specified section mi are output to the three-dimensional display unit 121, and the screen section Pmi associated with the two-dimensional coordinate is displayed with the color of the color value Ci (S120).

In concrete terms, in the front displaying state, the three-dimensional display unit 121 displays a screen section Pmi corresponding to a two-dimensional coordinate (Mxi, Myi) with the color of the color value Ci. In the lateral displaying state, the three-dimensional display unit 121 displays a screen section Pmi corresponding to a two-dimensional coordinate (Myi, Mzi) with the color of the color value Ci.

Here, the three-dimensional display unit 121 reads in periodically the memory 304 for displaying screen mesh frames PMi, the memory 305 for displaying the camera images, and the memory 306 for displaying spectrum waveforms, and displays the screen mesh frame PMi, the photographed image, and the spectrum waveform on the display device 120.

It is judged whether the processing at Step S120 has been performed for all the drawn sections mi (S121).

When the processing at Step S120 has not been performed for all the drawn sections mi, one of the sections mi for which the processing has not been performed is specified (S122). Thereafter, the process is made to return to Step S120.

When the processing at Step S120 has been performed for all the drawn sections mi, the process is made to end.

The above is the processing of the analytical distribution output unit 119 in the analysis displaying state with a single distance.

(Processing of the Analytical Distribution Output Unit 119 in the Analysis Displaying Mode with a Specified Distance Range)

Figure 18:
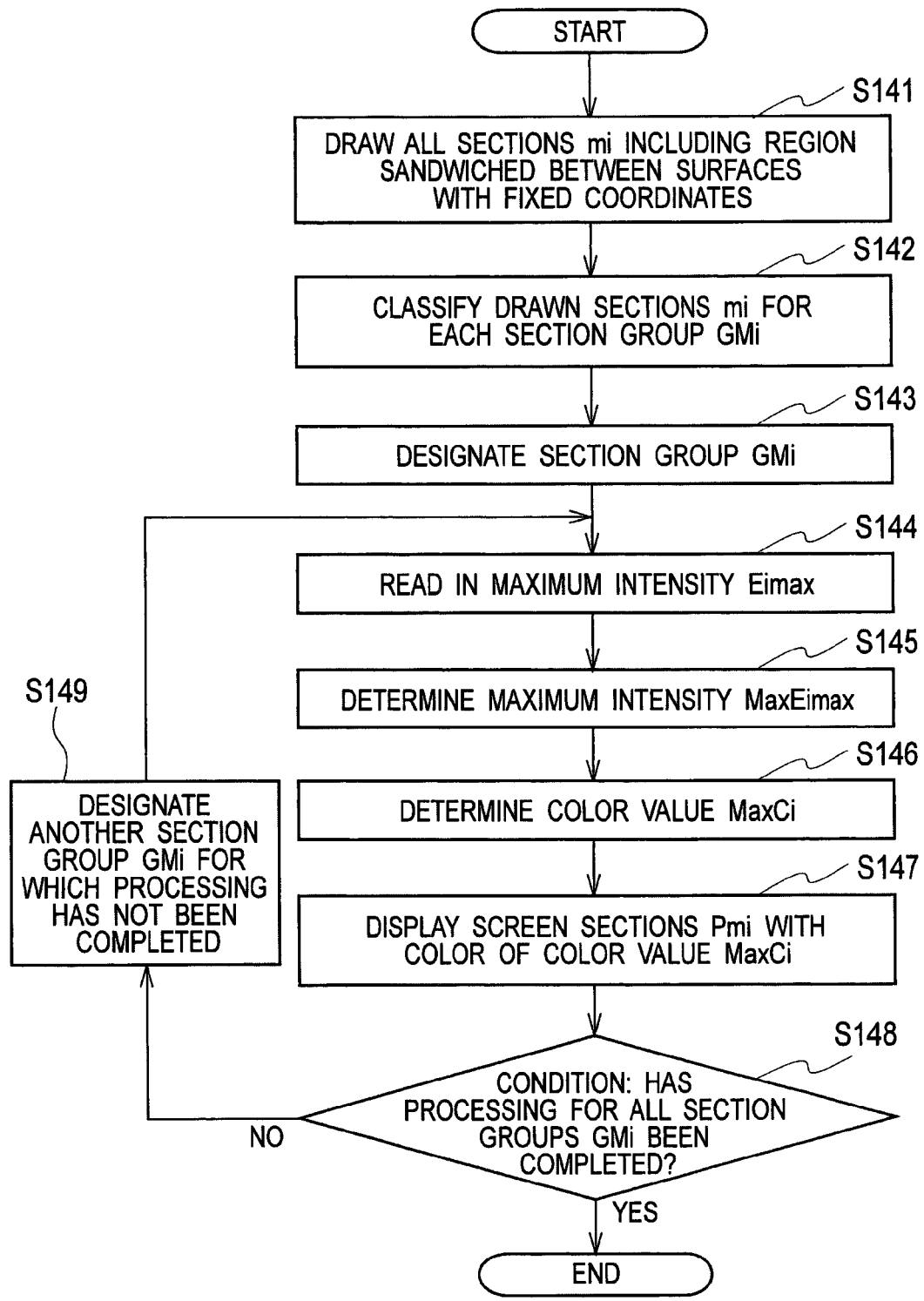
FIG. 18 is a flowchart illustrating operations when the analytical distribution output unit 119 is in an analysis displaying mode with a specified distance range.

FIG. 18 is a flowchart illustrating operations in the case where the analytical distribution output unit 119 is an analysis displaying mode with a specified distance range.

A measurer specifies two values as a distance di.

In the front displaying state, two sheets of faces with a given Z-axis coordinate are specified with the two values specified as a distance di. The intensity distribution creating unit 254 performs processing for displaying an intensity distribution diagram Qi on a region sandwiched between the specified two sheets of faces with a given Z-axis coordinate in the measurement space Ai.

In the lateral displaying state, two sheets of faces with a given X-axis coordinate are specified with the two values specified as a distance di. The intensity distribution creating unit 254 performs processing for displaying an intensity distribution diagram Qi on a region sandwiched between the specified two sheets of faces with a given X-axis coordinate in the measurement space Ai.

Although the distance di is defined as a factor representing the Z-axis coordinate or the X-axis coordinate, the distance di may be defined as a distance from the front of the measurement space Ai, or a distance from the lateral of the measurement space Ai.

The intensity distribution diagram creating unit 254 draws up all sections mi including a region sandwiched between two sheets of faces with a given coordinate in the measurement space Ai (S141).

Then, the intensity distribution diagram creating unit 254 classifies all the drawn sections mi for each section group GMi of sections mi having the same two-dimensional coordinate (S142).

Each section mi in one section group GMi has the same two-dimensional coordinate (Mxi, Myi) in the front displaying state, and has the same two-dimensional coordinate (Myi, Mzi) in the lateral displaying state.

Successively, the intensity distribution diagram creating unit 254 specifies one of all the section groups GMi (S143).

The maximum intensity Eimax assigned to each section mi in the specified section group GMi is read (S144).

The largest value among the read maximum intensities Eimax is defined as the maximum intensity MaxEimax assigned to the section group GMi (S145).

Here, the maximum intensity MaxEimax is defined as the largest value among the maximum intensities Eimax assigned to the respective sections mi belonging to the section group GMi. However, in conformity with an analyzing method, it may be defined as the average value of the maximum intensities Eimax assigned to the respective sections mi. Alternatively, the maximum intensity MaxEimax may be determined by the other methods.

Based on the color value table 117, the color value MaxCi corresponding to the maximum intensity MaxEimax is determined (S146).

A color value MaxCi determined in accordance with a section group GMi and a two-dimensional coordinate of a section mi belonging to the section group GMi are output to the three-dimensional display unit 121, whereby a screen section Pmi associated with the two-dimensional coordinate is displayed with the color of the color value MaxCi (S147).

Here, the three-dimensional display unit 121 reads in periodically the memory 304 for displaying a screen mesh frame PMi, the memory 305 for displaying a camera image, and the memory 306 for displaying a spectrum waveform, and displays a screen mesh frame PMi, a photographed image, and a spectrum waveform on the display device 120.

It is judged whether the processing from Step S144 to Step 147 has been performed for all the section groups GMi (S148).

When the processing from Step S144 to Step 147 has not been performed for all the section groups GMi, one of the section groups GMi for which the processing has not been performed is specified (S149). Thereafter, the process is made to return to Step S144.

When the processing from Step S144 to Step 147 has been performed for all the section groups GMi, the process is made to end.

The above is the processing of the analytical distribution output unit 119 in the analysis displaying mode with a specified distance range.

Figure 19:
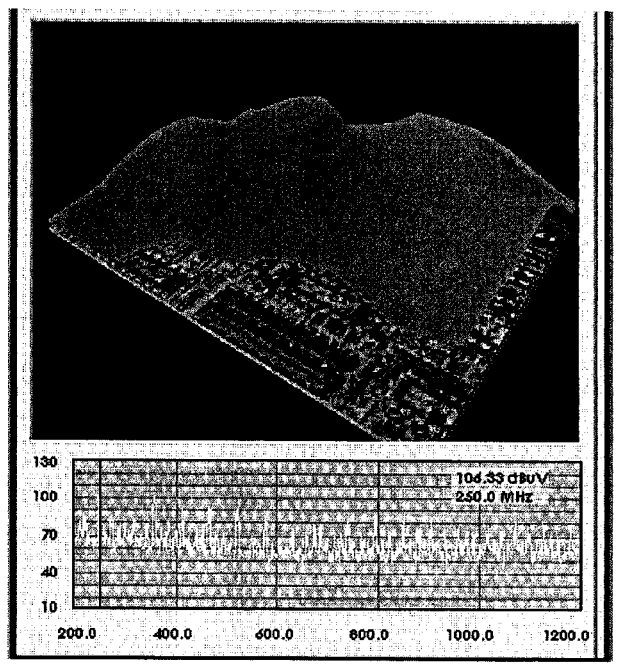
FIG. 19 is an explanatory drawing illustrating a 3D display screen.

Here, the analytical distribution output unit 119 may construct a surface model by combining the maximum intensities assigned to the respective sections of the analytical three-dimensional space model KAMi, and may output this to the three-dimensional display unit 121 so as to perform a 3D display with an input viewing angle (refer to FIG. 19).

In the post registration completion mode, the spectrum data determining unit 256 other than the analytical distribution output unit 119 analyzes spectrum data Hi in accordance with the parameter set by the measurer. The spectrum data determining unit 256 reads out the spectrum data Hi detected by the sensor 11 at one point specified by a measurer in the measurement space Ai from the memory 115, and analyzes the read spectrum data Hi.

Here, the measurer can specify one point in the measurement space Ai by specifying a screen section Pmi of the screen mesh frame PMi and a distance di. Namely, the measurer specifies a screen section Pmi of the screen mesh frame PMi with a cursor on a screen, and inputs (specifies) a distance di with a not-shown distance value input box, whereby a three-dimensional position in the three-dimensional space can be determined. Accordingly, as a result, one point in the measurement space Ai can be specified.

(Description of a Spectrum Data Determining Unit)

Figure 20:
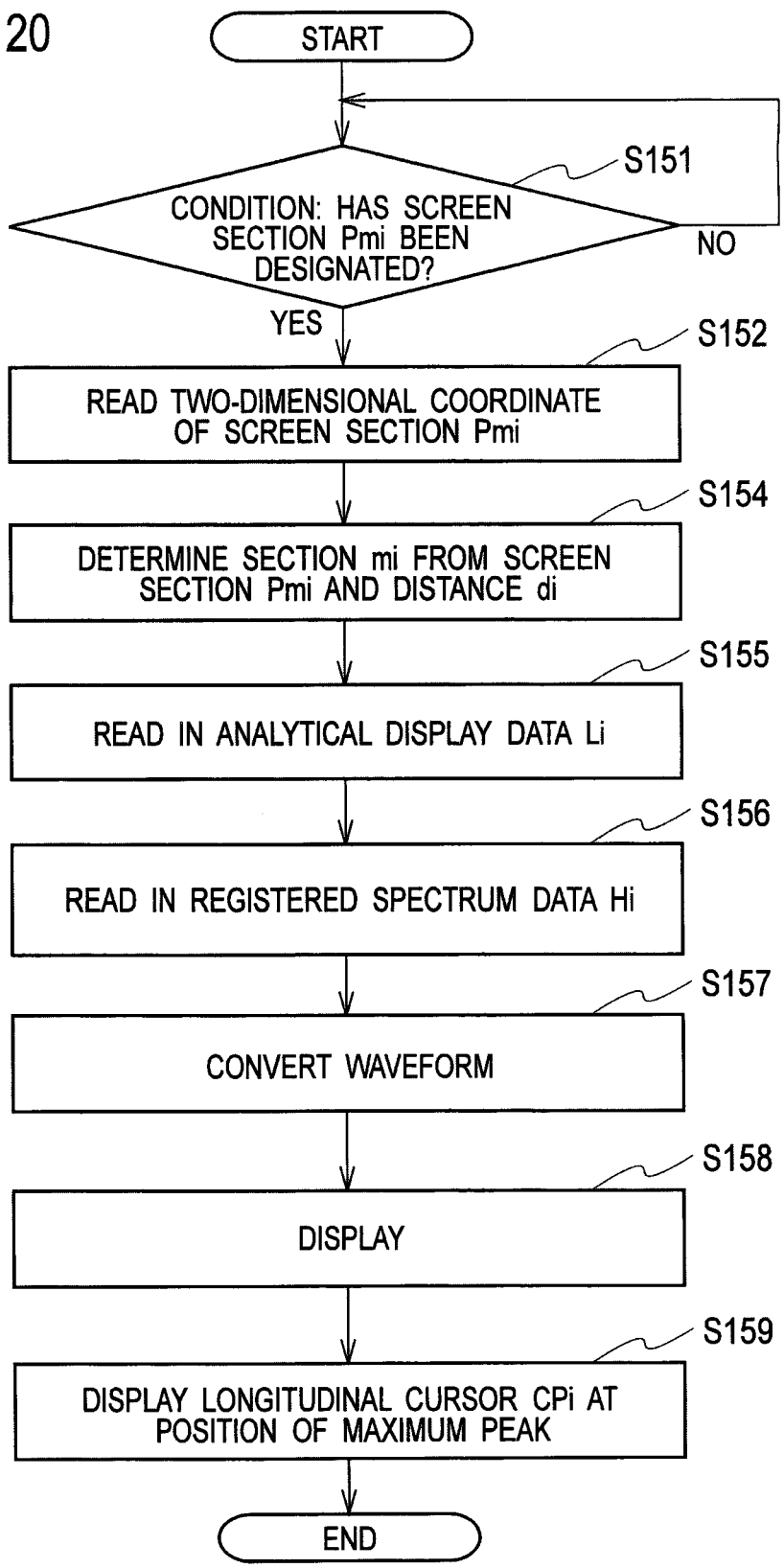
FIG. 20 is a flowchart illustrating processing of spectrum data display.
Figure 21:
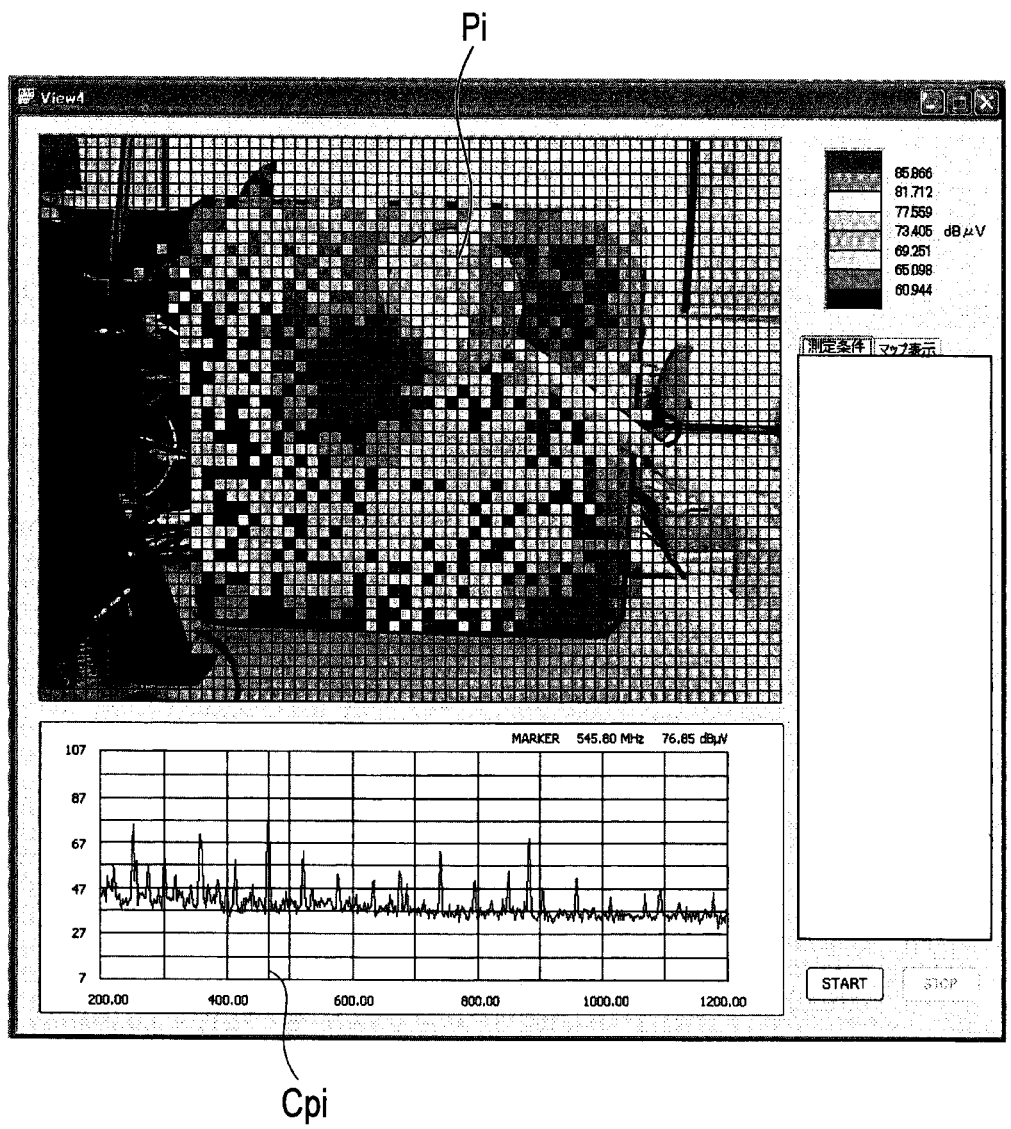
FIG. 21 is an explanatory drawing of the spectrum data display.

FIG. 20 is a flowchart illustrating the processing of spectrum data display. FIG. 21 is an illustration for describing spectrum data display.

The spectrum data determining unit 256 judges whether display instruction for spectrum has been given by a measurer. When the display instruction has been given, it is judged whether a screen section Pmi of the screen mesh frame PMi displayed on the display device 120 has been specified by the measurer (S151).

In Step S151, when it is judged that the screen section Pmi has been specified, the two-dimensional coordinate of this screen section Pmi is read (S152).

In the post registration completion mode, it is to be noted that a distance di has been set up. A coordinate held in common by respective sections mi including a cross section specified with a distance di in the measurement space Ai is the Z-axis coordinate in the front displaying state and the X-axis coordinate in the lateral displaying state.

Based on the two-dimensional coordinate of the screen section Pmi determined at Step S152 and the coordinate specified with the distance di, a section mi of the analytical three-dimensional space model KAMi which includes one point in the measurement space Ai is determined (S154).

Then, the analytical display data Li assigned to this section mi are read from the memory 110b (S155).

Next, the registered spectrum data Hi corresponding to the signal acquisition number HFi of the registered spectrum data Hi contained in this analytical display data Li is read from the memory 115a (S156).

The read registered spectrum data Hi are subjected to waveform conversion (S157).

Thereafter, the data having been subjected to the waveform conversion are display by the three-dimensional display unit 121 (S158).

Successively, as shown in FIG. 21, a vertical cursor CPi is displayed on a portion at the maximum peak in the spectrum waveform on the screen by the three-dimensional display unit 121 (S159).

Namely, as shown in FIG. 21, when a screen section Pmi of the screen mesh frame PMi is specified, a section mi of the analytical three-dimensional space model KAMi corresponding to this specified point Pi is searched. Successively, the registered spectrum data Hi associated with the section mi is subjected to waveform conversion and displayed, and a longitudinal cursor CPi is displayed on the peak waveform of the maximum intensity.

Accordingly, it becomes possible to grasp the situation that what kind of frequency becomes the maximum in the screen section Pmi of the specified points Pi.

On the other hand, when display instruction for spectrum is given by the measurer, in the case where a frequency range Ffi (for example, 400 to 600 MHz) is also specified simultaneously with the screen section Pmi, the spectrum data determining unit 256 performs the processing described below.

When a frequency range Ffi is not specified, as described until now, the analytical distribution output unit 119 displays in a color the intensity distribution diagram Qi by using the maximum intensity Eimax in the measured whole frequency range. When a frequency range Ffi is specified, the spectrum data determining unit 256 acquires the maximum intensity RfEimax in the specified frequency range Ffi, and the analytical distribution output unit 119 displays in a color the intensity distribution diagram Qi with the color value Ci corresponding to the maximum intensity RfEimax.

Figure 22:
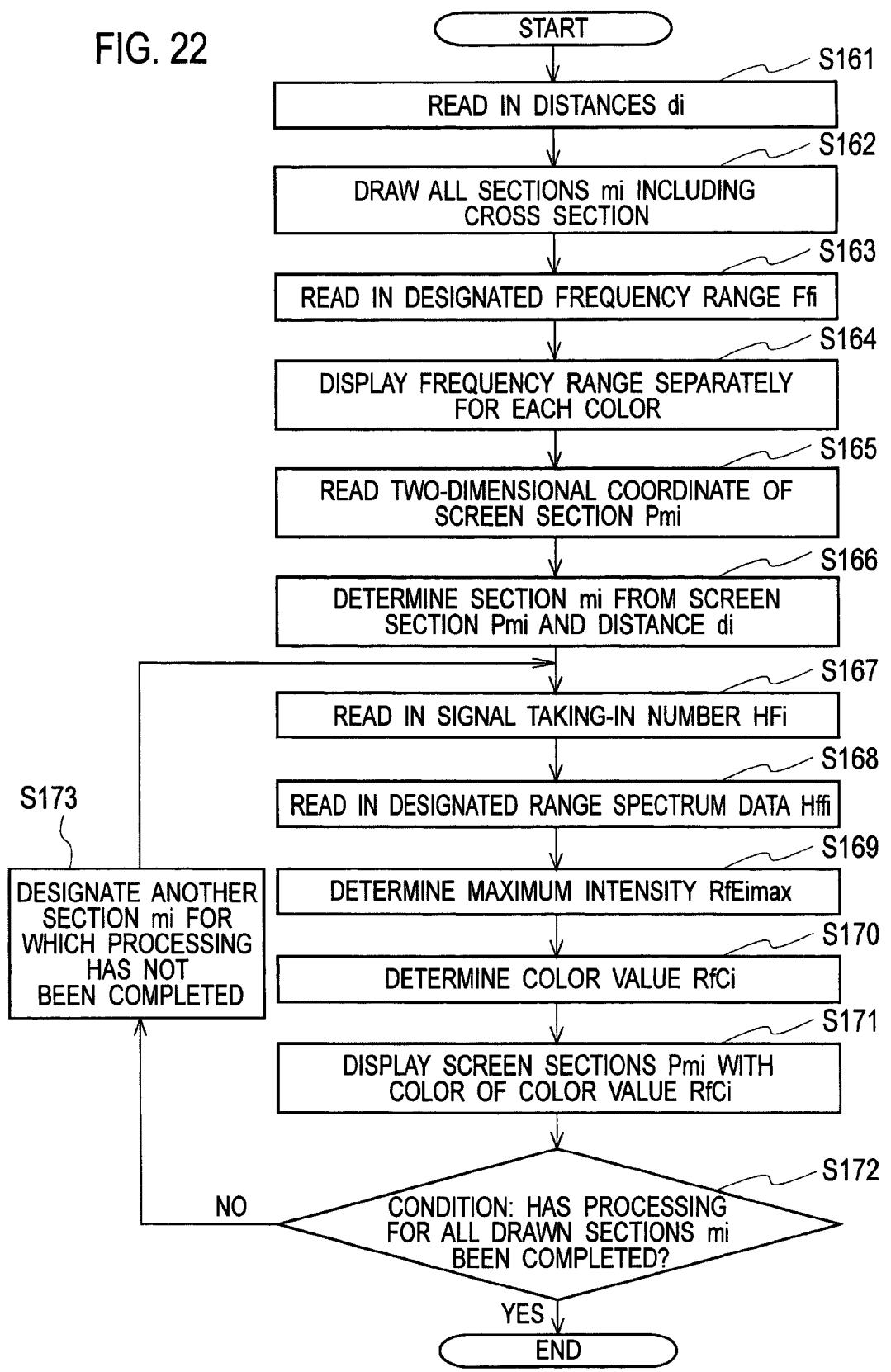
FIG. 22 is a flowchart illustrating processing of the spectrum data display when a frequency range Ffi is specified.

FIG. 22 is a flowchart illustrating the processing of spectrum data display when a frequency range Ffi is specified.

Figure 23:
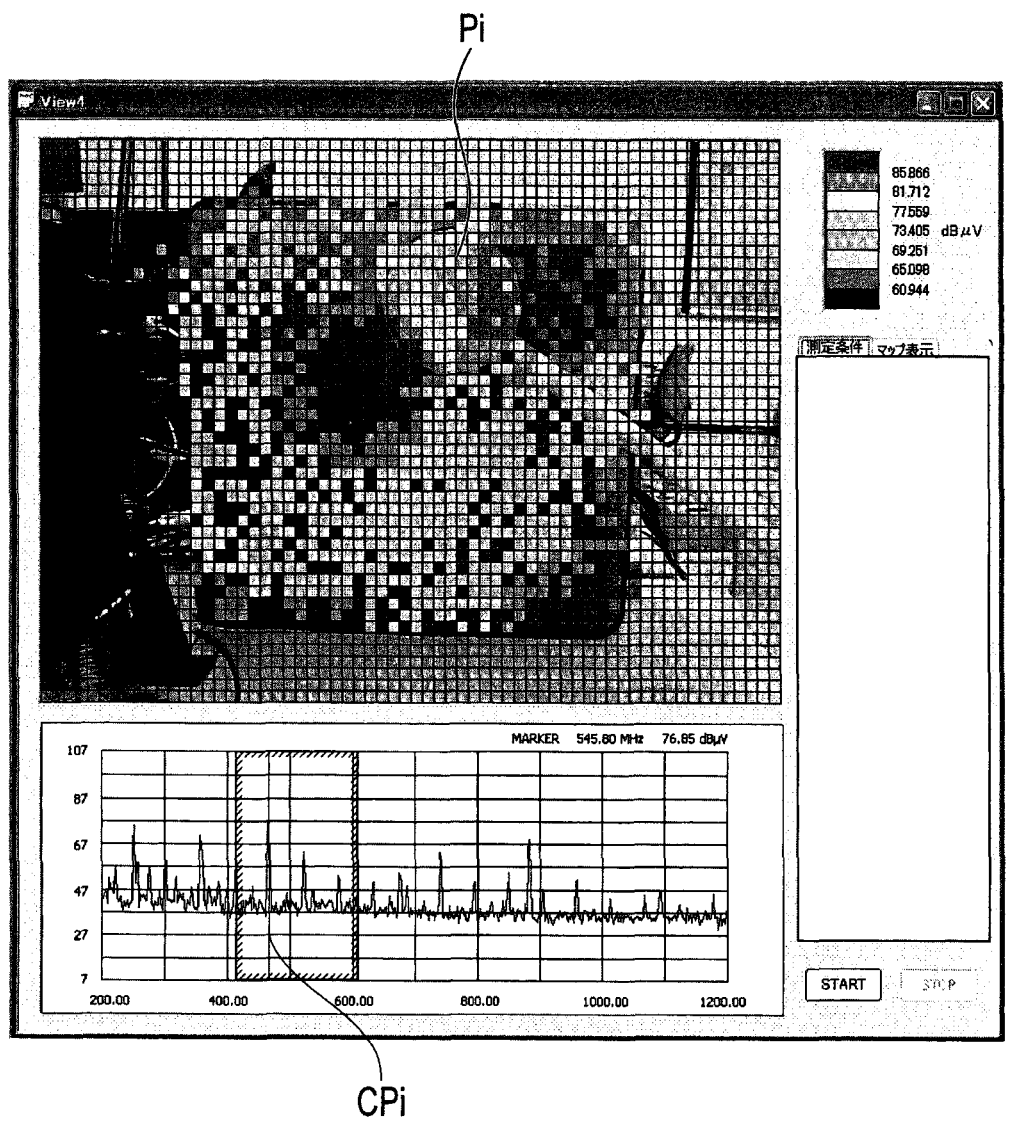
FIG. 23 is an explanatory drawing of the spectrum data display when a frequency range Ffi is specified.

FIG. 23 is an explanatory drawing illustrating spectrum data display when a frequency range Ffi is specified.

When a frequency range Ffi is specified by a measurer, the spectrum data determining unit 256 reads a distance di set up by the measurer (S161).

The intensity distribution diagram creating unit 254 draws up all sections mi including a cross section of the measurement space Ai specified with a distance di (S162).

Next, the spectrum data determining unit 256 reads the specified frequency range Ffi (S163).

As shown in FIG. 23, based on the frequency range Ffi, the three-dimensional display unit 121 displays in a color the frequency range corresponding to the spectrum waveform of the screen (S164). In FIG. 23, the frequency range displayed in a color is indicated with a region bordered with a pattern of slanted lines.

The spectrum data determining unit 256 judges whether a screen section Pmi of the screen mesh frame PMi displayed on the display device 120 has been specified by the measurer. When it is judged that a screen section Pmi has been specified, the spectrum data determining unit 256 reads the two-dimensional coordinate of the screen section Pmi (S165).

Based on the two-dimensional coordinate of the screen section Pmi determined at Step S164 and the coordinate specified with the distance di, a section mi of the analytical three-dimensional space model KAMi which includes one point in the measurement space Ai is determined (S166).

Next, the signal acquisition number HFi of the registered spectrum data Hi assigned to the section mi is read (S167).

Then, a portion of the frequency range Ffi of the registered spectrum data Hi of the signal acquisition number HFi is read as a specified range spectrum data Hffi from the memory 115 (S168).

Next, the maximum intensity RfEimax is read out from the specified range spectrum data Hffi (S169).

Then, the color value RfCi corresponding to the maximum intensity RfEimax in the frequency range Ffi is determined from the color value table 117 (S170).

Successively, the two-dimensional coordinate assigned to the section mi and the determined color value RfCi are output to the three-dimensional display unit 121 (S171). The three-dimensional display unit 121 displays in a color the screen section Pmi of the specified points Pi on the screen (refer to FIG. 23).

It is judged whether the processing from Step S167 to S171 has been performed for all the sections mi drawn at Step S162 (S172).

When the processing from Step S167 to S171 has not been performed for all the sections mi drawn at Step S162, one of the sections mi for which the processing has not been performed is specified (S172). Thereafter, the process is made to return to Step S167.

When the processing from Step S167 to S171 has been performed for all the sections mi drawn at Step S162, the process is made to end.

With the above processing, in place of the maximum intensity Eimax in the whole frequency range, the intensity distribution diagram Qi is displayed in a color with the maximum intensity RfEimax in the frequency range Ffi.

Accordingly, it becomes possible to grasp the situation that what kind of frequency becomes dominant in the specified frequency range in the specified point Pi (section).

Modified Embodiment

Figure 24:
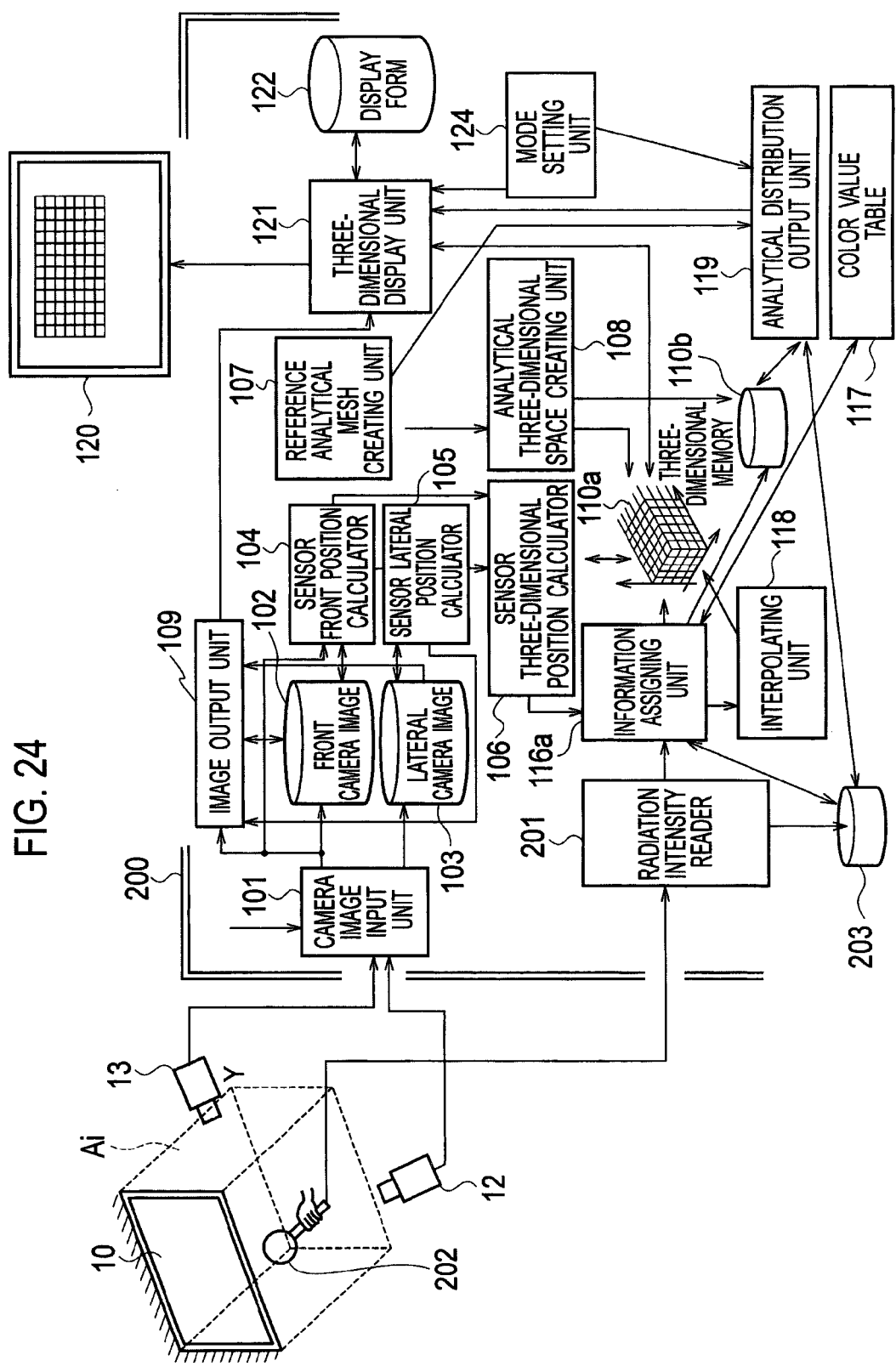
FIG. 24 is an outline configuration diagram of an emission signal visualization device of another embodiment.

FIG. 24 is an outline configuration diagram of the emission signal visualization device of another embodiment. In FIG. 24, description is omitted for the same configuration as FIG. 5.

A measured object should not be limited to an IC substrate, a television set, etc., and may be electronic devices, buildings, foods, etc. which bear radiation. In this case, an emission signal visualization device is configured to display in a color the distribution of radiation from a measured object, and to visualize it.

In this embodiment, a radiation detecting sensor 202 is used as a sensor.

Further, a body unit 200 includes a radiation intensity reader 201. Further, it includes an information assigning unit 116a. The information assigning unit 116a is the same as the electromagnetic field information assigning unit 116.

The radiation intensity reader 201 stores detection values (digital values: radiation amount values) from the radiation detecting sensor 202 in the memory 203 for every given time Ti. For example, the detection value of radiation is stored by associating time information of a timer with date, location, the name of an object, etc. which are set beforehand.

Further, a measurement space Ai is defined at the front of a person or an object, and the above analytical three-dimensional space model KAMi is created in the three-dimensional memory 110a.

Furthermore, while making the radiation detecting sensor 202 held by the hand scan (move) upward, downward, rightward and leftward in the measurement space Ai, the sections of the analytical three-dimensional space model KAMi are defined based on the position of the radiation detecting sensor 202 determined by using the sensor front position calculator 104, the sensor lateral position calculator 105, and the sensor three-dimensional position calculator 106.

Moreover, the information assigning unit 116a assigns a radiation amount value detected by the radiation detecting sensor 202 to a corresponding section mi in the analytical three-dimensional space model KAMi. In concrete terms, the information assigning unit 116a stores the radiation amount value in the memory 110b as section management information MBi.

Further, the analytical distribution output unit 119 and the three-dimensional display unit 121 make the display device 120 display the front image AGi (or the registered front image AGir), and displays a screen section Pmi with a color corresponding to the radiation amount value in accordance with the input analysis type Ki.

Accordingly, by observing the screen of the display device 120, a person in charge of analysis can understand at a glance the situation that high radiation has occurred on which region.

Here, although the spectrum analyzer 15 is disposed outside the body unit in the above embodiments, the function of the spectrum analyzer 15 may be provided in the body unit.

Further, in the above embodiments, the description is given to the sensor to detect noises of electric devices or a radiation amount of a measured object. However, a sensor to detect a sound volume may be used so as to define the sound volume in an analytical three-dimensional space model KAMi, sections may be displayed in a color depending on a distance.

Furthermore, a sensor may be a temperature sensor.

Furthermore, in the above embodiments, description is given such that the analytical distribution output unit 119 outputs the two-dimensional coordinate assigned to a section mi of the analytical three-dimensional space model KAMi to the three-dimensional display unit 121. However, in the case where the three-dimensional display unit 121 takes out only a two-dimensional coordinate from the three-dimensional coordinate, the screen sections Pmi may be displayed in a color by outputting the three-dimensional coordinate.

Moreover, in the case where the output of the spectrum analyzer 15 is analog data, an A/D converter may be provided in the spectrum data reader 114 so as to digitize analog spectrum data taken for every given time T1 in the input frequency range, and the digitized data may be used as the abovementioned spectrum data.

INDUSTRIAL APPLICABILITY

According to an emission signal visualization device pertaining to the present invention, by making a sensor scan (move) upward, downward, rightward and leftward in a tree-dimensional space around a measured object, it becomes possible to record a state of the spatial distribution of noises. The recorded data can be used in an analytic work after measurement. With this, it becomes possible to analyze the distribution, intensity, etc. of noises in a three-dimensional space, and to grasp the characteristics of the intensity and frequency of noises.

REFERENCE SIGNS LIST

10 Measured object
11 Sensor
12 Front video camera
13 Lateral video camera
15 Spectrum analyzer
100 Analyzing body unit
101 Camera image input unit
107 Reference analytical mesh creating unit
108 Analytical three-dimensional space creating unit
109 Image output unit
104 Sensor front position calculator
105 Sensor lateral position calculator
106 Sensor three-dimensional position calculator
114 Spectrum data reader
116 Electromagnetic field information assigning unit
119 Analytical distribution output unit

The invention claimed is:

1. An emission signal visualization device which acquires a signal generated from a measured object as a detection signal while moving a sensor in a rectangular parallelepiped measurement space with one surface stationarily facing a measured object and displays a signal level of the detection signal in a color on a display device, the emission signal visualization device comprising:
   a photographed image storage unit configured to store a photographed image acquired by photographing the measurement space for every given time;
   a three-dimensional memory that stores, in an analytical three-dimensional space model defined as a lattice-shaped mesh in which the measurement space is divided into a depth direction, a lateral width direction, and a height direction at respective given intervals, each section of the analytical three-dimensional space model in association with section management information including a three-dimensional coordinate of each section in the analytical three-dimensional space model, the detection signal, and a color value of a maximum signal level in the detection signal;
   a unit configured to display the photographed image stored in the photographed image storage unit on the display device;
   a unit configured to overlap and display a screen mesh frame constituted by screen sections associated with the section as a mesh frame for displaying an analytical result and the photographed image;
   a unit configured to sequentially specify the sections having a depth coordinate corresponding to a specified distance from the measured object;
   a unit configured to read, for each specified section, a two-dimensional coordinate constituting the three-dimensional coordinate assigned to the section and the color value assigned to the section; and
   a unit configured to display the screen section corresponding to the two-dimensional coordinate with a color of the read color value.

2. The emission signal visualization device according to claim 1, wherein a largest signal level in the detection signal acquired for the every given time is further assigned together with the color value to the section of the analytical three-dimensional space model in the three-dimensional memory, and wherein
   the emission signal visualization device further comprises:
   a unit configured to sequentially specify the sections having a depth coordinate corresponding to a specified distance range from the measured object;
   a unit configured to classify the specified sections for each section group of sections having the same two-dimensional coordinate:
   a unit configured to read each the largest signal level assigned to each section belonging to the section group for each the section group and to determine the largest value among the largest signal levels as a largest intensity signal level; and
   a unit configured to display the screen section corresponding to the two-dimensional coordinate with a color of a color value corresponding to the largest intensity signal level.

3. The emission signal visualization device according to claim 1, wherein
   the section management information includes a signal acquisition number to identify the detection signal, and wherein
   the emission signal visualization device further comprises:
   a signal storage unit configured to store the detection signal acquired for the every given time in association with the signal acquisition number; and
   a unit configured to display the detection signal identified by the signal acquisition number together with a mesh frame for displaying the analytical result on the display device.

4. The emission signal visualization device according to claim 1, further comprising:
   a first video camera that photographs the measurement space from a front direction;
   a second video camera that photographs the measurement space from a lateral direction;
   a color value table that shows a correspondence relation between the signal level and the color value;
   an image input unit configured to acquire the photographed image from the first video camera and the photographed image from the second video camera for every given time and to store these images in association with each other in the photographed image storage unit;
   a unit configured to generate a first photographed image from the first video camera or a second photographed image from the second video camera on the display device;
   a unit configured to create the analytical three-dimensional space model defined as a lattice-shaped mesh in which the measurement space is divided into a depth direction, a lateral width direction, and a height direction at respective given intervals;

a unit configured to detect a cluster of neighboring pixels having color information of the sensor from the first photographed image and to set the cluster to be a shape image of the sensor from the front direction;

a unit configured to detect a cluster of neighboring pixels having color information of the sensor from the second photographed images and to set the cluster to be a shape image of the sensor from the lateral direction;

a unit configured to determine a sensor position from a center position of the shape image of the sensor from the front direction and a center position of the shape image of the sensor from the lateral direction, and to define a section including the sensor position in the analytical three-dimensional space model as a section corresponding to the sensor position; and a unit configured to determine, each time a section corresponding to the sensor position is defined in the analytical three-dimensional space model, a color value corresponding to the largest signal level in the detection signal in the section from the color value table, and to assign the color value to the defined section.

5. The emission signal visualization device according to claim 1, further comprising, in a case where the sensor is a frequency information detecting sensor to detect a signal containing frequency information, a frequency analyzer configured to calculate spectrum data of a detection signal detected by the frequency information detecting sensor as the detection signal.

6. The emission signal visualization device according to claim 5, wherein the frequency information detecting sensor is an electromagnetic field detecting sensor or a sound detecting sensor which detects a signal containing frequency information.

7. The emission signal visualization device according to claim 1, wherein the sensor is a radiation detecting sensor that detects radiation, digitizes this detection signal, and outputs the digitized detection signal as the detection signal.

8. The emission signal visualization device according to claim 1, wherein the sensor is a temperature detection sensor that detects a temperature, digitizes this detection signal, and outputs the digitized detection signal as the detection signal.

* * * * *